(12) United States Patent
Hirota et al.

(10) Patent No.: US 8,723,618 B2
(45) Date of Patent: May 13, 2014

(54) POWER COMBINER/DISTRIBUTOR AND TRANSMITTER USING THE POWER COMBINER/DISTRIBUTOR

(75) Inventors: Akimichi Hirota, Tokyo (JP); Yukihiro Tahara, Tokyo (JP); Naofumi Yoneda, Tokyo (JP); Yuji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 302 days.

(21) Appl. No.: 13/084,868

(22) Filed: Apr. 12, 2011

(65) Prior Publication Data

US 2011/0260771 A1   Oct. 27, 2011

(30) Foreign Application Priority Data

Apr. 26, 2010   (JP) .................................. 2010-101241

(51) Int. Cl.
*H01P 5/12* (2006.01)
*H03H 7/38* (2006.01)

(52) U.S. Cl.
USPC ............................................ 333/125; 333/33

(58) Field of Classification Search
USPC .......................................... 333/125–128, 32
See application file for complete search history.

(56) References Cited

U.S. PATENT DOCUMENTS

| | | | | |
|---|---|---|---|---|
| 5,162,756 A | * | 11/1992 | Taniguchi et al. | 330/295 |
| 7,005,942 B2 | * | 2/2006 | Culliton et al. | 333/125 |
| 7,514,994 B2 | * | 4/2009 | Fraysse | 330/124 R |
| 2005/0030122 A1 | * | 2/2005 | Nation | 333/104 |

FOREIGN PATENT DOCUMENTS

| | | |
|---|---|---|
| JP | 60-121303 U | 8/1985 |
| JP | 2007-150377 | 6/2007 |

OTHER PUBLICATIONS

Japanese Office Action issued Sep. 17, 2013 in Patent Application No. 2010-101241 with English Translation.

* cited by examiner

*Primary Examiner* — Robert Pascal
*Assistant Examiner* — Kimberly Glenn
(74) *Attorney, Agent, or Firm* — Oblon, Spivak, McClelland, Maier & Neustadt, L.L.P.

(57) ABSTRACT

The power combiner/distributor for performing one of power combination and power division, includes: a first branch circuit (117) having a plurality of first branch side terminals (113, 114) connected in parallel and one first combination side terminal (115), which are connected through a first power combination point (116); and a second branch circuit (137) having a plurality of second branch side terminals (133, 134) connected in parallel and one second combination side terminal (135) connected through a second power combination point (136), the one first combination side terminal and the one of plurality of second branch side terminals being connected to each other, in which a length from the first power combination point to the second power combination point is an integral multiple of ½ wavelength.

17 Claims, 21 Drawing Sheets

(a)

(b)

POWER COMBINER/DISTRIBUTOR AND TRANSMITTER USING THE POWER COMBINER/DISTRIBUTOR

BACKGROUND OF THE INVENTION

1. Field of the Invention

The present invention relates to a power combiner/distributor used in a microwave band, and a transmitter using the power combiner/distributor, and more particularly, to a countermeasure to reduce a distribution loss or a combination loss.

2. Description of the Related Art

The power combiner/distributor has been widely used for combining or distributing power. In the case where the power is distributed and input to a plurality of amplifiers that operate in parallel, or in the case where the powers from the amplifiers are combined together, when a part of the amplifiers that operate in parallel fail, impedances at input/output terminals of the failed amplifier change. As a result, the distribution loss or the combination loss occurs in the power combiner/distributor.

There is a method in which the power combiner/distributor is configured by a directional coupler in order to reduce such distribution loss or combination loss (for example, Japanese Patent Application Laid-open No. 2007-150377). In the power combiner/distributor thus configured, the failed amplifier is removed, and a terminal of the power combiner/distributor from which the amplifier has been removed is short-circuited or opened. As a result, because reflected power of the opened terminal is input to a termination resistor of the directional coupler, no impedance mismatching occurs, and the combination loss or the distribution loss can be reduced.

However, the related art suffers from the following problem.

In the conventional power combiner/distributor, the combination loss and the distribution loss are not caused by the impedance mismatching. However, power absorbed by the termination resistor of the directional coupler connected to the terminal from which the failed amplifier has been removed is lost. That is, the conventional power combiner/distributor suffers from such a problem that the power absorbed by at least the termination resistor is lost.

SUMMARY OF THE INVENTION

The present invention has been made to solve the above-mentioned problem, and an object to provide a power combiner/distributor that minimizes a distribution loss or a combination loss of the power combiner/distributor even if a part of a plurality of amplifiers fail when power is distributed to the plurality of amplifiers that operate in parallel, or when the powers from the plurality of amplifiers are combined together, and a transmitter using the power combiner/distributor.

A power combiner/distributor for performing one of power combination and power division of the present invention includes: a first branch circuit having a plurality of first branch side terminals connected in parallel and one first combination side terminal, which are connected through a first power combination point; and a second branch circuit having a plurality of second branch side terminals connected in parallel and one second combination side terminal, which are connected through a second power combination point, the one first combination side terminal and one of the plurality of second branch side terminals being connected to each other, in which a length from the first power combination point to the second power combination point is an integral multiple of ½ wavelength.

Further, a power combiner/distributor for performing one of power combination and power division of the present invention includes: a, first branch circuit having a plurality of first branch side terminals connected in series and one first combination side terminal, which are connected through a first power combination point; and a second branch circuit having a plurality of second branch side terminals connected in series and one second combination side terminal, which are connected through a second power combination point, the one first combination side terminal and one of the plurality of second branch side terminals being connected to each other, in which a length from the first power combination point to the second power combination point is an integral multiple of ½ wavelength.

Further, a power combiner/distributor for performing one of power combination and power division of the present invention includes: a first branch circuit having a plurality of first branch side terminals connected in series and one first combination side terminal, which are connected through a first power combination point; and a second branch circuit having a plurality of second branch side terminals connected in series and one second combination side terminal, which are connected through a second power combination point, the one first combination side terminal and one of the plurality of second branch side terminals being connected to each other, in which a length from the first power combination point to the second power combination point is an odd multiple of ¼ wavelength.

Further, a power combiner/distributor for performing one of power combination and power division, of the present invention includes: a first branch circuit having a plurality of first branch side terminals connected in parallel and one first combination side terminal, which are connected through a first power combination point; and a second branch circuit having a plurality of second branch side terminals connected in series and one second combination side terminal, which are connected through a second power combination point, the one first combination side terminal and one of the plurality of second branch side terminals being connected to each other, in which a length from the first power combination point to the second power combination point is an odd multiple of ¼ wavelength.

According to the power combiner/distributor and the transmitter using the power combiner/distributor of the present invention, a connection line length between the stages is determined according to the number and length of impedance transformers disposed between the power combination points of the two connected branch circuits, and the power combiner/distributor is constituted by using such a connection line. As a result, when the electric power is distributed to the plurality of amplifiers that operate in parallel or when the electric powers from the plurality of amplifiers are combined together, the power combiner/distributor that minimizes the distribution loss or the combination loss thereof even if a part of the plurality of amplifiers fail, and the transmitter using the power combiner/distributor can be obtained.

DETAILED DESCRIPTION OF THE PREFERRED EMBODIMENTS

Hereinafter, preferred embodiments of a power combiner/distributor and a transmitter using the power combiner/distributor according to the present invention are described with reference to the accompanying drawings. Note that, in the respective drawings, the same or corresponding parts are denoted by the same reference symbols for description. In the following embodiments, a case in which the power combiner/distributor is used as a power combiner that combines powers together is mainly described. The power combiner/distributor may also be used as a power divider that divides the power, and the same effects can be obtained.

First Embodiment

Figure 1:
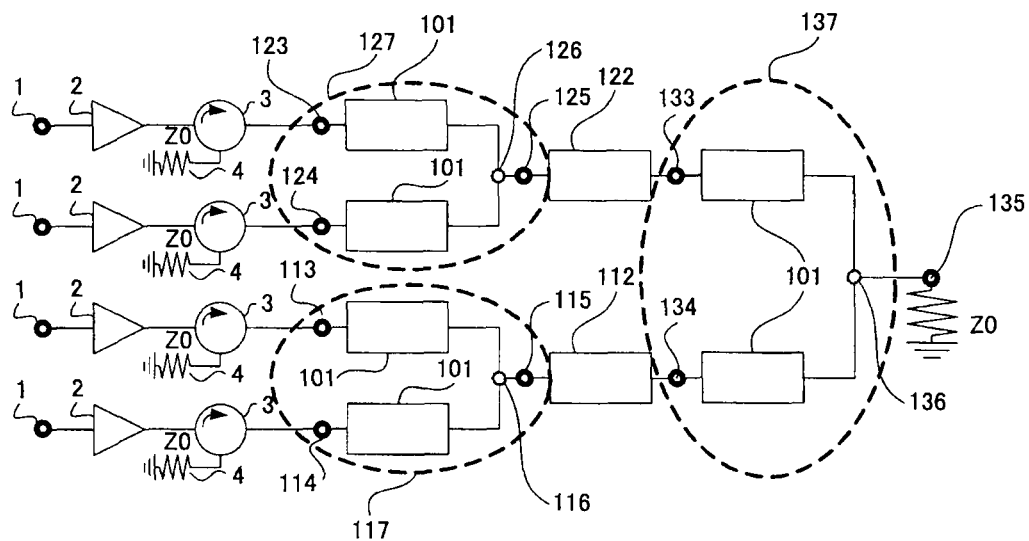
FIG. 1 is a circuit diagram of a power combiner according to a first embodiment of the present invention.

FIG. 1 is a circuit diagram of a power combiner according to a first embodiment of the present invention. The power combiner according to the first embodiment illustrated in FIG. 1 includes first impedance transformers 101, first connection lines 112 and 122, first branch side terminals 113, 114, 123, 124, 133, and 134, first combination side terminals 115, 125, and 135, and first power combination points 116, 126, and 136. Each of the first connection lines 112 and 122 has an electrical length equal to an odd multiple of about ¼ wavelength.

The power combiner/distributor illustrated in FIG. 1 has three first branch circuits 117, 127, and 137 (corresponding to portions indicated by dotted circles of FIG. 1), and the three first branch circuits 117, 127, and 137 are connected through the first connection lines 112 and 122 in a tournament fashion. The first branch circuit 117 includes the first impedance transformers 101, the first branch side terminals 113 and 114, the first combination side terminal 115, and the first power combination point 116.

Further, the first branch circuit 127 includes the first impedance transformers 101, the first branch side terminals 123 and 124, the first combination side terminal 125, and the first power combination point 126. Further, the first branch circuit 137 includes the first impedance transformers 101, the first branch side terminals 133 and 134, the first combination side terminal 135, and the first power combination point 136. The first impedance transformers 101 used within the three first branch circuits 117, 127, and 137 correspond to impedance opening means.

Further, an input part provided at the pre-stage of the first branch circuits 117 and 127 includes input terminals 1, amplifiers 2, circulators 3, and termination resistors 4.

In this embodiment, impedances of the input terminal 1 side at the first branch side terminals 113, 114, 123, 124, 133, and 134, impedances of the first power combination point side at the first combination side terminals 115, 125, and 135, and impedances of the first connection lines 112 and 122 are the same value of Z0.

That is, when the first branch circuit 117 is described as an example, the first impedance transformers 101 are each configured by a line, which has the impedance of Zt represented by the following Expression (1), having an electrical length equal to an odd multiple of ¼ wavelength so that the impedance of the first branch side terminal 113 side or the first branch side terminal 114 side at the first power combination point 116 becomes 2Z0. Accordingly, an electrical length between the first power combination point 116 and the first power combination point 136, and an electrical length between the first power combination point 126 and the first power combination point 136 each become an integral multiple of ½ wavelength.

[Ex. 1]

$$Z_1 = \sqrt{2Z_0 \times Z_0} \qquad (1)$$

Next, operation of the power combiner according to the first embodiment of the present invention is described. First, a case in which all of the plurality of amplifiers connected to the power combiner according to the first embodiment of the present invention operate normally is considered. It is assumed that the same signals are input to the input terminals 1 of the respective amplifiers, the input electric powers are amplified by the respective amplifiers 2, and the amplified electric powers are input to the respective first branch side terminals 113, 114, 123, and 124 as signals having the same amplitude phase. Further, it is assumed that the impedances at the first branch side terminals 113, 114, 123, and 124 are Z0.

The impedances of the first branch side terminal 113 side and the first branch side terminal 114 side at the first power combination point 116 become 2Z0 by the first impedance transformers 101, respectively. Accordingly, the impedance of the first power combination point 116 side at the first combination side terminal 115 becomes Z0. Further, the impedance of the first connection line 112 is also Z0, and hence the impedance of the first branch circuit 117 side at the first branch side terminal 134 becomes Z0.

The first branch circuit 127 is similar to the first branch circuit 117, and hence the impedances of the first branch circuits 127 and 117 side at the first branch side terminals 133 and 134, respectively, become Z0. Accordingly, the first branch circuit 137 is also similar to the first branch circuit 117, and hence the impedance of the first power combination point 136 side at the first combination side terminal 135 becomes Z0. Further, a load impedance connected to the first combination side terminal 135 is also Z0.

From the above viewpoint, the electric powers input to the input terminals 1 of the amplifiers are amplified by the amplifiers 2, combined together without any loss caused by impedance mismatching, and the combined power is output from the first combination side terminal 135.

Figure 2:
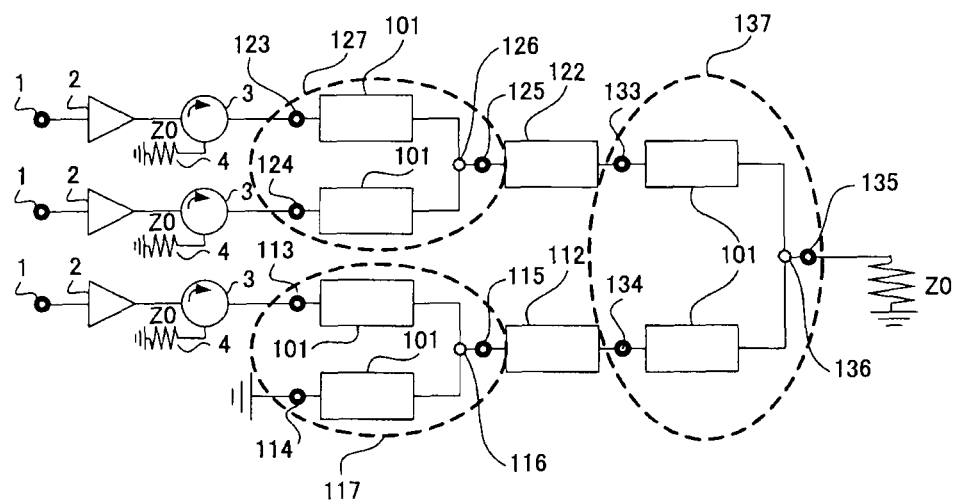
FIG. 2 is a circuit diagram of the power combiner according to the first embodiment of the present invention, in which an amplifier connected to a first branch side terminal fails.

Next, there is considered a case in which, among the plurality of amplifiers connected to the power combiner/distributor according to the first embodiment of the present invention, the amplifier connected to the first branch side terminal 114 fails, and signals are input only from the first branch side terminals 113, 123, and 124. FIG. 2 is a circuit diagram of the power combiner according to the first embodiment of the present invention, in which the amplifier connected to the first branch side terminal 114 fails. FIG. 2 illustrates a state in which, when the above-mentioned failure occurs, the failed amplifier is removed from the power combiner, and the first branch side terminal 114 is so terminated as to be short-circuited.

The amplifiers connected to the first branch circuit 127 operate in the normal state, and hence the impedance of the first branch circuit 127 side at the first branch side terminal 133 becomes Z0.

The electrical length of each of the first impedance transformers 101 is equal to an odd multiple of ¼ wavelength, and hence the impedance of the first branch side terminal 114 side at the first power combination point 116 is opened. On the other hand, the impedance of the first branch side terminal 113 side at the first power combination point 116 becomes 2Z0 by the first impedance transformers 101. Accordingly, the impedance of the first power combination point 116 side at the first combination side terminal 115 becomes 2Z0.

The first connection line 112 has the impedance of Z0 and an electrical length equal to an odd multiple of ¼ wavelength. Accordingly, the first connection line 112 functions as the impedance transformer, and the impedance of the first connection line 112 side at the first branch side terminal 134 becomes Z0/2. Then, the impedance is transformed by the first impedance transformers 101, and hence the impedance of the first branch side terminal 134 side at the first power combination point 136 becomes 4Z0.

That is, the impedance of the first branch side terminal 133 side at the first power combination point 136 is 2Z0, and the impedance of the first branch side terminal 134 side at the first power combination point 136 is 4Z0. Accordingly, the first branch circuit 137 is a first branch circuit that combines the electric powers together without impedance mismatching when the electric power from the first branch side terminal 133 side and the electric power from the first branch side terminal 134 side are combined together at a ratio of 2:1.

On the other hand, the signal input from the first branch side terminal 134 side is only an electric power from the amplifier connected to the first branch side terminal 113, and the signal input from the first branch side terminal 133 side is a combined electric power from the two amplifiers connected to the first branch side terminals 123 and 124. From this viewpoint, the ratio of the electric power from the first branch side terminal 133 side and the electric power from the first branch side terminal 134 side is 2:1. As a result, the electric powers are combined together without any loss caused by the impedance mismatching within the power combiner, and the combined power is output from the first combination side terminal 135.

As described above, according to the power combiner of the first embodiment, when the amplifiers that operate in parallel operate normally, the electric powers can be combined together without any combination loss caused by the impedance mismatching within the power combiner. Further, even when a part of the amplifiers that operate in parallel fail, the first branch side terminal connected to the failed amplifier is short-circuited so that the electric powers can be combined together without any combination loss caused by the impedance mismatching within the power combiner.

Note that, in the first embodiment, the first impedance transformer is the line having the impedance represented by the above Expression (1) and the electrical length equal to the odd multiple of ¼ wavelength. However, the present invention is not limited to the above configuration, and may be configured by impedance transformers, such as impedance transformers in which ¼ wavelength are cascade-connected in series with each other, or impedance transformers using tapered lines, which can realize the impedance matching at the first branch circuits 117, 127, and 137 when the amplifiers operate normally. Further, the length of the first connection line may be determined so that the electrical length between the first power combination point 116 and the first power combination point 136, and the electrical length between the first power combination point 126 and the first power combination point 136 each become the integral multiple of ½ wavelength.

Further, in the first embodiment, a case in which only the amplifier connected to the first branch side terminal 114 fails is described. However, the present invention is not limited to this case, and even if a plurality of amplifiers connected to the first branch side terminals fail, the terminals connected to the failed amplifiers are short-circuited to obtain the same effects.

Figure 3:
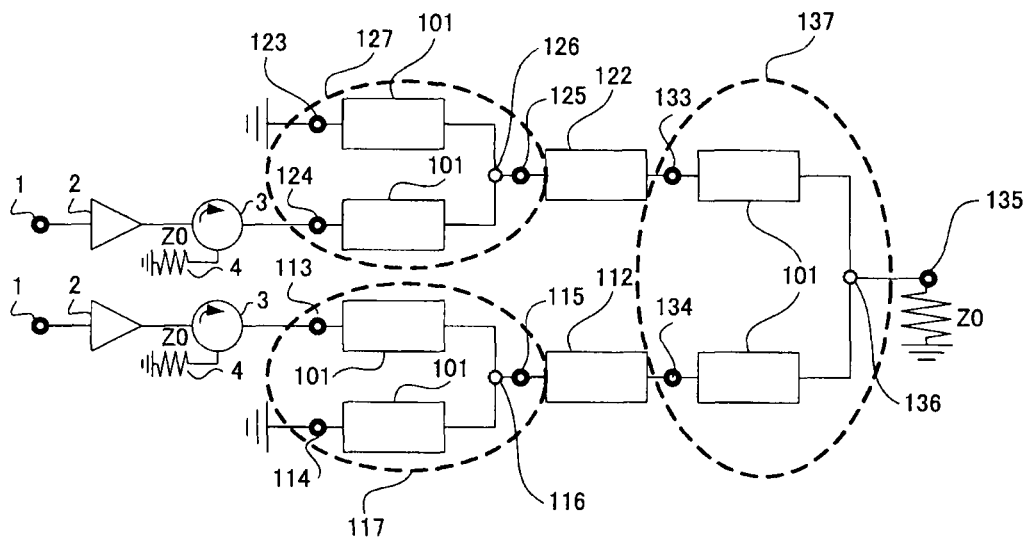
FIG. 3 is a circuit diagram of the power combiner according to the first embodiment of the present invention, in which respective amplifiers connected to two first branch side terminals fail.

FIG. 3 is a circuit diagram of the power combiner according to the first embodiment of the present invention, in which two amplifiers connected to the first branch side terminal 114 and the first branch side terminal 123 fail. FIG. 3 illustrates a state in which, when the above-mentioned failure occurs, both of the failed two amplifiers are removed from the power combiner, and the first branch side terminal 114 and the first branch side terminal 123 are so terminated as to be short-circuited. In this way, even when two or more amplifiers fail, the respective first branch side terminals connected to the failed amplifiers are short-circuited to obtain the same effects.

Further, in the first embodiment, when the amplifiers connected in parallel operate normally, all of the impedances of the circuits connected to the first branch side terminals 113, 114, 123, 124, 133, and 134, and the first combination side terminal 135 are the same as each other. However, the present invention is not limited to this configuration, and the respective load impedances may be arbitrary values. Note that, the circuits within the power combiner are designed to have such values that no impedance mismatching occurs when the amplifiers connected in parallel operate normally.

Further, in the first embodiment, three first branch circuits are connected in a tournament fashion. However, the present invention is not limited to this configuration, and two first branch circuits only need to be connected by the first connection line. For example, $(2^n-1)$ first branch circuits (n is a natural number) may be connected in the tournament fashion or connected in series.

Further, in the first embodiment, the first branch circuits 117, 127, and 137 each having two first branch side terminals and one first combination side terminal are connected in the tournament fashion. However, the present invention is not limited to this configuration, and a part or all of the first branch circuits may be each configured by a first branch circuit having K first branch side terminals (K is an integer of two or more) and one first combination side terminal.

Further, in the first embodiment, when the amplifier connected to the first branch side terminal 114 fails, the first branch side terminal 114 is short-circuited. However, the present invention is not limited to this configuration, and the first branch side terminal 114 where the amplifier fails only needs to be terminated so that the impedance of the first branch side terminal 114 side at the first power combination point 116 is opened. For example, the present invention may be applied to a line having the electrical length of ¼ wavelength whose leading end is opened to the first branch side terminal 114, or a line having the electrical length equal to the integral multiple of ½ wavelength whose leading end is short-circuited.

Further, in the first embodiment, when the amplifier connected to the first branch side terminal 114 fails, the impedance of the first combination side terminal 135 becomes $4/3Z_0$ because the impedance of $2Z_0$ of the first branch side terminal 133 side at the first power combination point 136 and the impedance of $4Z_0$ of the first branch side terminal 134 side at the first power combination point 136 are connected in parallel.

Figure 4:
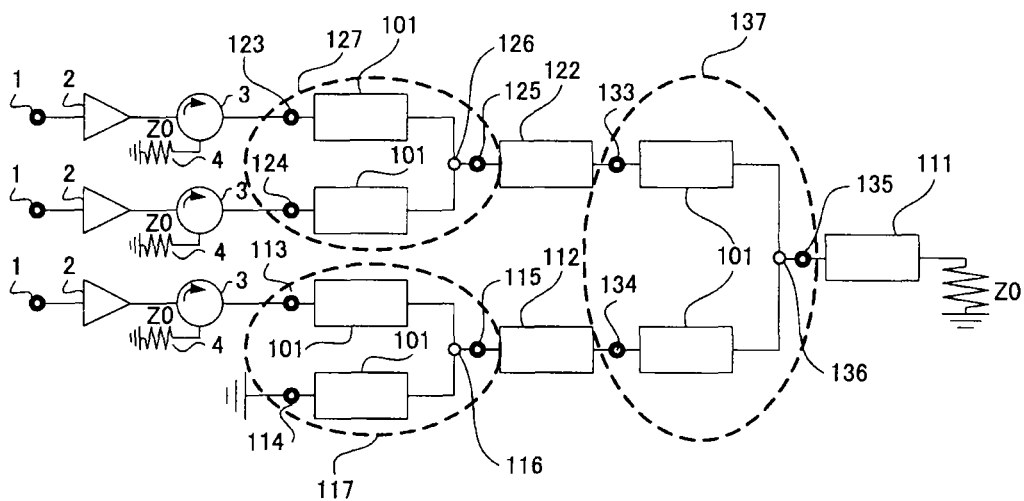
FIG. 4 is a circuit diagram of the power combiner according to the first embodiment of the present invention, in which a reflection loss is set to 0 when the amplifier connected to the first branch side terminal fails.

On the other hand, the load impedance connected to the first combination side terminal 135 is $Z_0$, and hence the impedance mismatching occurs in the first combination side terminal 135, resulting in a reflection loss. FIG. 4 is a circuit diagram of the power combiner according to the first embodiment of the present invention, in which the reflection loss is set to 0 when the amplifier connected to the first branch side terminal 114 fails. As illustrated in FIG. 4, the reflection loss can be set to 0 by realizing the impedance matching at the first combination side terminal 135, for example, by connecting, to the first combination side terminal 135, such that a first matching impedance transformer 111 that is a line having an electrical length equal to an odd multiple of ¼ wavelength and an impedance represented by the following Expression (2).

[Ex. 2]

$$2Z_0/\sqrt{3} \qquad (2)$$

Further, as illustrated in FIG. 4, when one of the four amplifiers fails, the above Expression (2) is satisfied. On the other hand, in a case where, when M (M is an integer of two or more) amplifiers operate in parallel, N (N is an integer equal to or more than 1 and less than M) amplifiers operate normally, and (M−N) amplifiers fail, the reflection loss can be set to 0 by realizing the impedance matching at the first combination side terminal 135, for example, by connecting, to the first combination side terminal 135, the first matching impedance transformer 111 that is a line having the impedance represented by the following Expression (3).

[Ex. 3]

$$\sqrt{\sqrt{M/N}Z_0} \qquad (3)$$

Note that, in FIG. 4, the first matching impedance transformer 111 is connected to the first power combination point 136. However, the present invention is not limited to this configuration, and as the impedance where the reflection loss becomes 0, the first matching impedance transformers 111 may be connected between the first branch side terminals 113, 114, 123, and 124, and the circulators 3, respectively. In this case, the respective first matching impedance transformers 111 are given as a line having the impedance represented by the following Expression (4) assuming that, when M (M is an integer of 2 or more) amplifiers operate in parallel, N (N is an integer equal to or more than 1 and less than M) amplifiers operate normally, and (M−N) amplifiers fail.

[Ex. 4]

$$\sqrt{\sqrt{N/M}Z_0} \qquad (4)$$

Further, in the first embodiment, the first matching impedance transformer 111 is configured by an impedance transformer that is a line having the electrical length of an odd multiple of ¼ wavelength and the impedance represented by the above Expression (2). However, the present invention is not limited to this configuration, and the impedance transformer that matches the impedance mismatching at the first combination side terminal 135 may be connected according to the short-circuited first branch side terminal to obtain the same effects.

Further, in the first embodiment, a case in which the electric powers of the plurality of amplifiers that operate in parallel are combined together is described. However, the present invention is not limited to this case, and the same effects are obtained even when electric powers from a plurality of antennas are combined together. Further, in the first embodiment, the power combiner that combines the electric powers together is described. However, the same effects are obtained even when the present invention is used as a power divider that divides the electric power.

Second Embodiment

Figure 5:
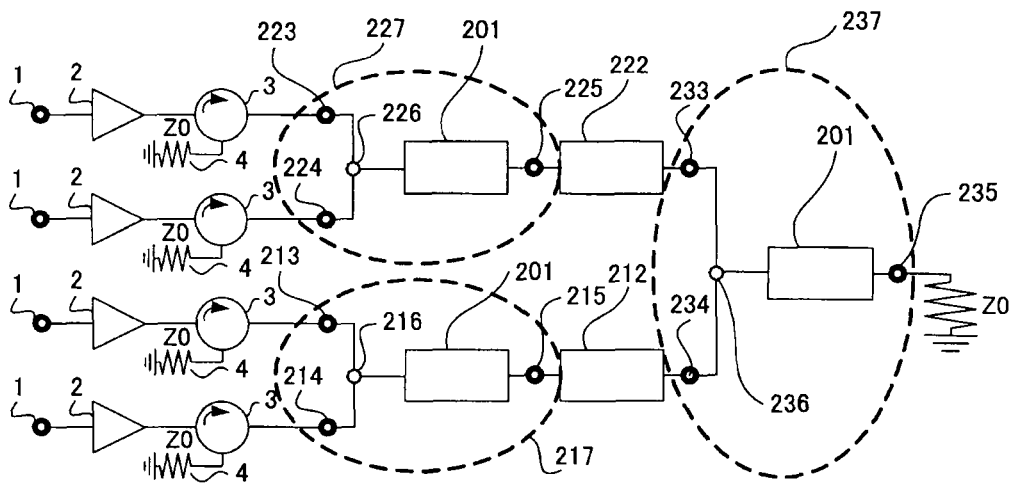
FIG. 5 is a circuit diagram of a power combiner according to a second embodiment of the present invention.

FIG. 5 is a circuit diagram of a power combiner according to a second embodiment of the present invention. The power combiner according to the second embodiment illustrated in FIG. 5 includes second impedance transformers 201, second connection lines 212 and 222, second branch side terminals 213, 214, 223, 224, 233, and 234, second combination side terminals 215, 225, and 235, and second power combination points 216, 226, and 236. Each of the second connection lines 212 and 222 has an electrical length equal to an odd multiple of about ¼ wavelength.

The power combiner/distributor illustrated in FIG. 5 has three second branch circuits 217, 227, and 237 (corresponding to portions indicated by dotted circles of FIG. 5), and the three second branch circuits 217, 227, and 237 are connected through the second connection lines 212 and 222 in a tournament fashion. The second branch circuit 217 includes the second impedance transformer 201, the second branch side terminals 213 and 214, the second combination side terminal 215, and the second power combination point 216.

Further, the second branch circuit 227 includes the second impedance transformer 201, the second branch side terminals 223 and 224, the second combination side terminal 225, and the second power combination point 226. Further, the second branch circuit 237 includes the second impedance transformer 201, the second branch side terminals 233 and 234, the second combination side terminal 235, and the second power combination point 236. The second impedance transformers 201 used within the three second branch circuits 217, 227, and 237 correspond to the impedance opening means.

Further, an input part provided at the pre-stage of the second branch circuits 217 and 227 includes the input terminals 1, the amplifiers 2, the circulators 3, and the termination resistors 4.

In this embodiment, impedances of the input terminal 1 side at the second branch side terminals 213, 214, 223, 224, 233, and 234, impedances of the second power combination point side at the second combination side terminals 215, 225, and 235, and impedances of the second connection lines 212 and 222 are the same value of Z0.

That is, when the second branch circuit 217 is described as an example, the second impedance transformer 201 is configured by a line, which has the impedance of $Z_{t2}$ represented by the following Expression (5), having an electrical length equal to an odd multiple of ¼ wavelength so that the impedance of the second power combination point 216 side at the second combination side terminal 215 becomes Z0. Accordingly, the length of the second connection line is determined so that an electrical length between the second power combination point 216 and the second power combination point 236, and an electrical length between the second power combination point 226 and the second power combination point 236 each become the integral multiple of ½ wavelength.

[Ex. 5]

$$Z_{t2} = \sqrt{\frac{Z_0 \times Z_0}{2}} \qquad (5)$$

Next, the operation of the power combiner according to the second embodiment of the present invention is described. First, a case in which all of the plurality of amplifiers connected to the power combiner according to the second embodiment of the present invention operate normally is considered. It is assumed that the same signals are input to the input terminals 1 of the respective amplifiers, the input electric powers are amplified by the respective amplifiers 2, and the amplified electric powers are input to the respective second branch side terminals 213, 214, 223, and 224 as signals having the same amplitude phase.

In this embodiment, it is assumed that the impedances at the second branch side terminals 213, 214, 223, and 224 are Z0. The signals input to the second branch side terminal 213 and the second branch side terminal 214 are input to the second power combination point 216.

The combination impedance of the second branch side terminal 213 side and the second branch side terminal 214 side at the second power combination point 216 is Z0/2 because the respective impedances at the second branch side terminal 213 and the second branch side terminal 214 which are connected in parallel are Z0. The impedance of the second impedance transformer 201 side at the second combination side terminal 215 is transformed by the second impedance transformer 201, and becomes Z0.

The second branch circuit 227 is similar to the second branch circuit 217. Further, the impedances of the second connection lines 212 and 222 are Z0, and hence both of the impedance of the second connection line 222 side at the second branch side terminal 233 and the impedance of the second connection line 212 side at the second branch side terminal 234 are Z0. Accordingly, the impedance within the second branch circuit 237 is also similar to those of the second branch circuits 217 and 227, and the impedance of the second power combination point 236 side at the second combination side terminal 235 becomes Z0. A load impedance connected to the second combination side terminal 235 is also Z0.

From the above viewpoint, the signals input to the input terminals 1 of the amplifiers are amplified by the amplifiers 2, input to the second branch side terminals 213, 214, 223, and 224, combined together without any loss caused by the impedance mismatching within the power combiner, and the combined power is output from the second combination side terminal 235.

Figure 6:
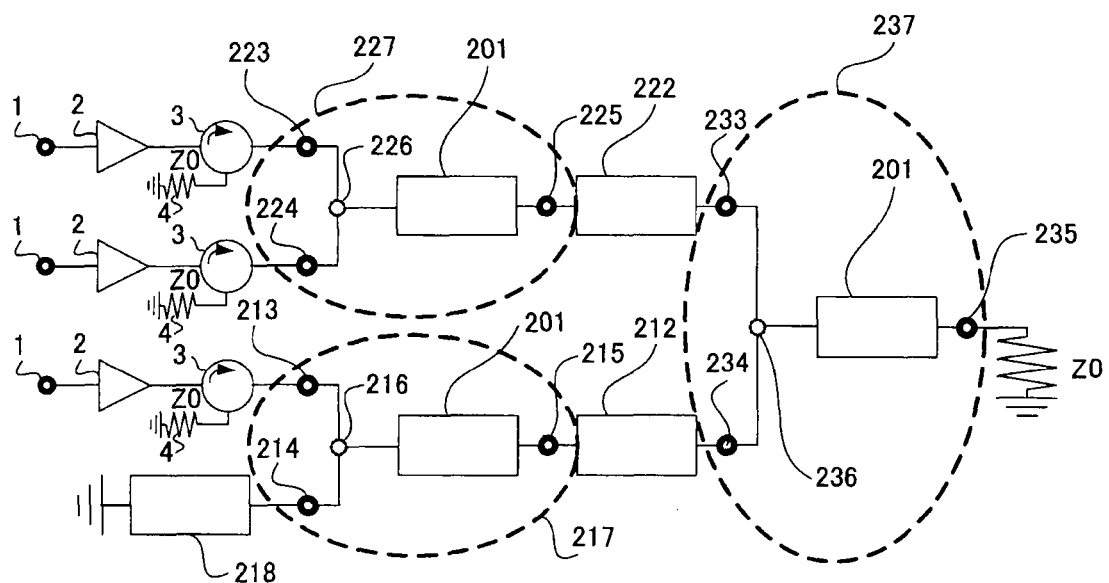
FIG. 6 is a circuit diagram of the power combiner according to the second embodiment of the present invention, in which an amplifier connected to a second branch side terminal fails.

Next, there is considered a case in which, among the plurality of amplifiers connected to the power combiner according to the second embodiment of the present invention, the amplifier connected to the second branch side terminal 214 fails, and the signals are input only from the second branch side terminals 213, 223, and 224. FIG. 6 is a circuit diagram of the power combiner according to the second embodiment of the present invention, in which the amplifier connected to the second branch side terminal 214 fails. FIG. 6 illustrates a state in which, when the above-mentioned failure occurs, the failed amplifier is removed, and the second branch side terminal 214 is terminated with a second termination line 218 having one side short-circuited, the impedance of Z0, and the electrical length of an odd multiple of ¼ wavelength. The second termination line 218 corresponds to the impedance opening means.

The amplifiers connected to the second branch circuit 227 operate in the normal state, and hence the impedance of the second combination side terminal 225 becomes Z0. Both of the impedance of the second connection line 222 and the impedance of the second combination side terminal 225 are Z0, and hence the impedance of the second branch side terminal 233 becomes Z0. Accordingly, the impedance of the second branch side terminal 233 side at the second power combination point 236 becomes Z0.

The electrical length of the second termination line 218 is equal to an odd multiple of ¼ wavelength, and hence the impedance of the second branch side terminal 214 side at the second power combination point 216 is opened. On the other hand, the impedance of the second branch side terminal 213 side at the second power combination point 216 side becomes Z0. The impedance is transformed by the second impedance transformer 201, and hence the impedance of the second power combination point 216 side at the second combination side terminal 215 becomes Z0/2.

The second connection line 212 has the impedance of Z0 and an electrical length equal to an odd multiple of ¼ wavelength. Accordingly, the second connection line 212 functions as the impedance transformer, and the impedance at the second branch side terminal 234 becomes 2Z0.

That is, the impedance of the second branch side terminal 233 side at the second power combination point 236 is Z0, and the impedance of the second branch side terminal 234 side at the second power combination point 236 is 2Z0. Accordingly, the second branch circuit 237 is a branch circuit that combines together the electric power from the second branch side terminal 233 side and the electric power from the second branch side terminal 234 side at a ratio of 2:1.

On the other hand, the signal input from the second branch side terminal 234 side is an electric power from the amplifier connected to the second branch side terminal 213, and the signal input from the second branch side terminal 233 side is a combined electric power from the two amplifiers connected to the second branch side terminals 223 and 224. From this viewpoint, the ratio of the electric power from the second branch side terminal 233 side and the electric power from the second branch side terminal 234 side is 2:1. As a result, the electric powers are combined together without any loss caused by the impedance mismatching within the power combiner, and the combined power is output from the second combination side terminal 235.

As described above, according to the power combiner of the second embodiment, when the amplifiers that operate in parallel operate normally, the electric powers can be combined together without any combination loss caused by the impedance mismatching within the power combiner. Further, even when a part of the amplifiers that operate in parallel fail, the second branch side terminal connected to the failed amplifier is terminated with the termination line so that the electric powers can be combined together without any combination loss caused by the impedance mismatching within the power combiner.

In the second embodiment, the second impedance transformer is the line having the impedance represented by the above Expression (5) and the electrical length equal to the odd multiple of ¼ wavelength. However, the present invention is not limited to the above configuration, and may be configured by impedance transformers, such as impedance transformers in which ¼ wavelength are cascade-connected in series with each other or impedance transformers using tapered lines, which can realize the impedance matching at the second branch circuits 217, 227, and 237 when the amplifiers operate normally. Further, the length of the second connection line may be determined so that the electrical length between the second power combination point 216 and the second power combination point 236, and the electrical length between the second power combination point 226 and the second power combination point 236 each become the integral multiple of ½ wavelength.

Further, in the second embodiment, a case in which only the amplifier connected to the second branch side terminal 214 fails is described. However, the present invention is not limited to this case, and even if a plurality of amplifiers connected to the second branch side terminals fail, the terminals connected to the failed amplifiers are terminated with the second termination line 218 to obtain the same effects.

Figure 7:
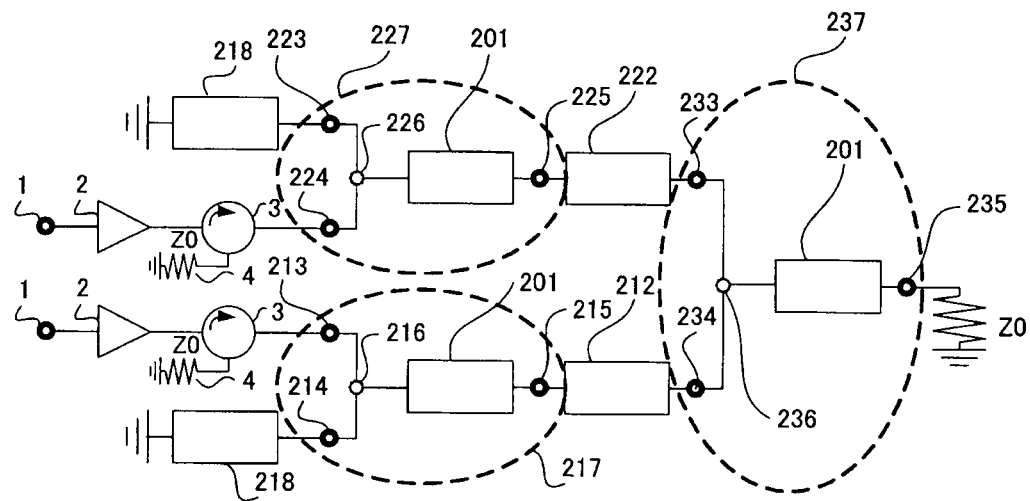
FIG. 7 is a circuit diagram of the power combiner according to the second embodiment of the present invention, in which respective amplifiers connected to two second branch side terminals fail.

FIG. 7 is a circuit diagram of the power combiner according to the second embodiment of the present invention, in which two amplifiers connected to the second branch side terminal 214 and the second branch side terminal 223 fail. FIG. 7 illustrates a state in which, when the above-mentioned failure occurs, both of the failed two amplifiers are removed from the power combiner, and the second branch side terminal 214 and the second branch side terminal 223 are each terminated with the second termination line 218. In this way, even when two or more amplifiers fail, the second branch side terminals connected to the failed amplifiers are each terminated with the second termination line 218 to obtain the same effects.

Further, in the second embodiment, when the amplifiers connected in parallel operate normally, all of the impedances of the circuits connected to the second branch side terminals 213, 214, 223, 224, 233, and 234, and the second combination side terminal 235 are the same as each other. However, the present invention is not limited to this configuration, and the respective load impedances may be arbitrary values. Note that, the circuits within the power combiner are designed to have such values that no impedance mismatching occurs when the amplifiers connected in parallel operate normally.

Further, in the second embodiment, three second branch circuits are connected in a tournament fashion. However, the present invention is not limited to this configuration, and two second branch circuits only need to be connected by the second connection line. For example, $(2^n-1)$ second branch circuits (n is a natural number) may be connected in the tournament fashion or connected in series.

Further, in the second embodiment, the second branch circuits 217, 227, and 237 each having two second branch side terminals and one second combination side terminal are connected in the tournament fashion. However, the present invention is not limited to this configuration, and a part or all of the second branch circuits may be each configured by a second branch circuit having K second branch side terminals (K is an integer of two or more) and one second combination side terminal.

Further, in the second embodiment, when the amplifier connected to the second branch side terminal 214 fails, the second branch side terminal 214 is terminated with the second termination line 218 having a leading end short-circuited and the electrical length of the odd multiple of ¼ wavelength. However, the present invention is not limited to this configuration, and the second branch side terminal 214 where the amplifier fails may be terminated with total reflection, for example, with a line having a leading end opened to the second branch side terminal 214 and the electrical length of the integral multiple of ½ wavelength, so that the impedance of the second branch side terminal 214 side at the second power combination point 216 becomes infinite.

Further, in the second embodiment, a case in which the amplifier connected to the second branch side terminal 214 fails is described. However, the present invention is not limited to this case, and even when the amplifiers connected to terminals other than the second branch side terminal 214 fail, the respective second branch side terminals connected to the failed amplifiers are terminated with the second termination lines, thereby obtaining the same effects.

Further, in the second embodiment, when the amplifier connected to the second branch side terminal 214 fails, the impedance of the second combination side terminal 235 becomes ⅔Z0 because the impedance Z0 of the second branch side terminal 233 side at the second power combination point 236 and the impedance Z0/2 of the second branch side terminal 234 side at the second power combination point 236 are connected in parallel.

The impedance is transformed by the second impedance transformer 201, and the impedance of the second impedance transformer side at the second combination side terminal 235 becomes ¾Z0.

Figure 8:
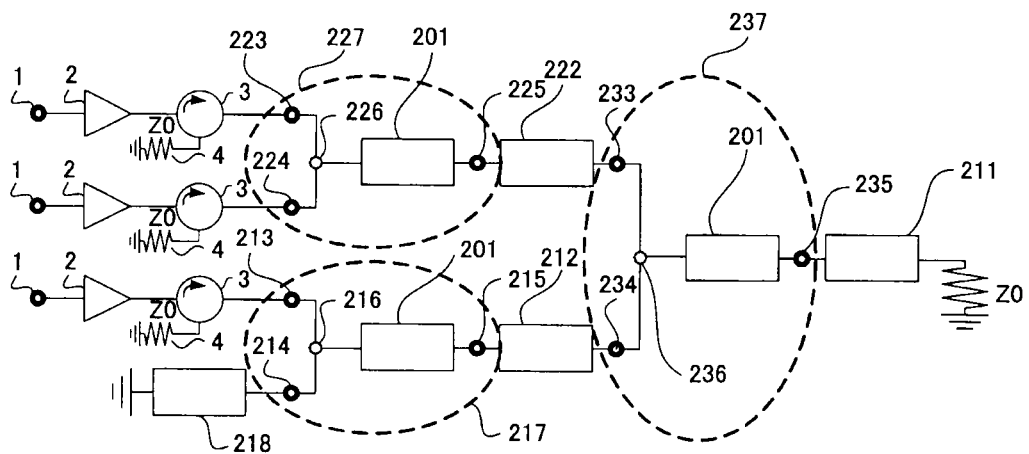
FIG. 8 is a circuit diagram of the power combiner according to the second embodiment of the present invention, in which the reflection loss is set to 0 when the amplifier connected to the second branch side terminal fails.

On the other hand, the load impedance connected to the second combination side terminal 235 is Z0, and hence impedance mismatching occurs in the second combination side terminal 235, resulting in a reflection loss. FIG. 8 is a circuit diagram of the power combiner according to the second embodiment of the present invention, in which the reflection loss is set to 0 when the amplifier connected to the second branch side terminal 214 fails. As illustrated in FIG. 8, the reflection loss can be set to 0 by realizing the impedance matching at the second combination side terminal 235 by connecting, to the second combination side terminal 235, a second matching impedance transformer 211 that is a line having an electrical length equal to an odd multiple of ¼ wavelength and an impedance represented by the following Expression (6).

[Ex. 6]

$$\sqrt{3}Z_0/2 \quad (6)$$

Further, as illustrated in FIG. 8, when one of the four amplifiers fails, the above Expression (6) is satisfied. On the other hand, in the case where, when M (M is an integer of two or more) amplifiers operate in parallel, N (N is an integer equal to or more than 1 and less than M) amplifiers operate normally, and (M−N) amplifiers fail, the reflection loss can be set to 0 by realizing the impedance matching at the second combination side terminal 235, by connecting, to the second combination side terminal 235, the second matching impedance transformer 211 that is a line having the impedance represented by the following Expression (7).

[Ex. 7]

$$\sqrt{\sqrt{N/M}Z_0} \quad (7)$$

Note that, in FIG. 8, the second matching impedance transformer 211 is connected to the second power combination point 236. However, the present invention is not limited to this configuration, and as the impedance where the reflection loss becomes 0, the second matching impedance transformers 211 may be connected between the second branch side terminals 213, 214, 223, and 224, and the circulators 3, respectively. In this case, the respective second matching impedance transformers 211 are given as a line having the impedance represented by the following Expression (8) assuming that, when M (M is an integer of 2 or more) amplifiers operate in parallel, N (N is an integer equal to or more than 1 and less than M) amplifiers operate normally, and (M−N) amplifiers fail.

[Ex. 8]

$$\sqrt{\sqrt{M/N}Z_0} \quad (8)$$

Further, in the second embodiment, the second matching impedance transformer 211 is configured by an impedance transformer that is a line having the electrical length of the odd multiple of ¼ wavelength and the impedance represented by the above Expression (6). However, the present invention is not limited to this configuration, and the same effects are obtained by connecting an impedance transformer that matches the impedance mismatching at the second combination side terminal 235. Alternatively, the same effects are obtained by changing the impedance of the second impedance transformer or the impedance of the second connection line so as to match the impedance mismatching at the second combination side terminal 235.

Further, in the second embodiment, a case in which the electric powers of the plurality of amplifiers that operate in parallel are combined together is described. However, the present invention is not limited to this case, and the same effects are obtained even when electric powers from a plurality of antennas are combined together. Further, in the second embodiment, the power combiner that combines the electric powers together is described. However, the same effects are obtained even when the present invention is used as a power divider that divides the electric power.

Third Embodiment

Figure 9:
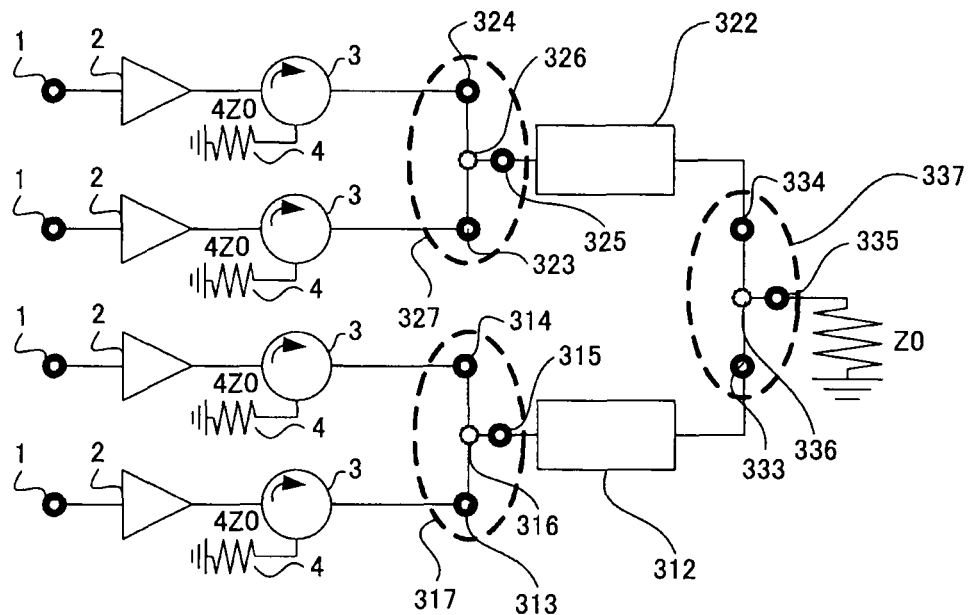
FIG. 9 is a circuit diagram of a power combiner according to a third embodiment of the present invention.

FIG. 9 is a circuit diagram of a power combiner according to a third embodiment of the present invention. The power combiner according to the third embodiment illustrated in FIG. 9 includes third connection lines 312 and 322, third branch side terminals 313, 314, 323, 324, 333, and 334, third combination side terminals 315, 325, and 335, and third power combination points 316, 326, and 336. Each of the third connection lines 312 and 322 has an electrical length equal to an integral multiple of about ½ wavelength.

The power combiner/distributor illustrated in FIG. 9 has three third branch circuits 317, 327, and 337 (corresponding to portions indicated by dotted circles of FIG. 9), and the three third branch circuits 317, 327, and 337 are connected through the third connection lines 312 and 322 in a tournament fashion. The third branch circuit 317 includes the third branch side terminals 313 and 314, the third combination side terminal 315, and the third power combination point 316.

Further, the third branch circuit 327 includes the third branch side terminals 323 and 324, the third combination side terminal 325, and the third power combination point 326. Further, the third branch circuit 337 includes the third branch side terminals 333 and 334, the third combination side terminal 335, and the third power combination point 336.

Further, an input part provided at the pre-stage of the third branch circuits 317 and 327 includes the input terminals 1, the amplifiers 2, the circulators 3, and the termination resistors 4. In this embodiment, the impedance of the termination resistor 4 is 4ZO.

In this embodiment, when it is assumed that the load impedance at the third combination side terminal is Z0, the impedances of the third connection lines 312 and 322 are 2Z0, and the impedances of the third branch side terminals 313, 314, 323, and 324 are 4Z0.

Next, operation of the power combiner according to the third embodiment of the present invention is described. First, a case in which all of the plurality of amplifiers connected to the power combiner according to the third embodiment of the present invention operate normally is considered. It is assumed that the same signals are input to the input terminals 1 of the respective amplifiers, and the input electric powers are amplified by the respective amplifiers 2, and the amplified electric powers are input to the respective third branch side terminals 313, 314, 323, and 324 as signals having the same amplitude phase.

Further, it is assumed that the impedances at the third branch side terminals 313, 314, 323, and 324 are 4Z0. In this case, the combination impedance of the third branch side terminals 313 and 314 side at the third power combination point 316 becomes 2Z0 because the impedances of 4Z0 are connected in parallel. The third branch circuit 327 is also similar to the third branch circuit 317, and the impedance of the third power combination point 326 side at the third combination side terminal 325 becomes 2Z0.

Accordingly, the third power combination point 336 is connected in parallel to the impedance of 2Z0 of the third branch side terminals 333 and 334 side, and hence the combination impedance of the third branch side terminals 333 and 334 side at the third power combination point 336 becomes Z0. In this embodiment, the load impedance connected to the third combination side terminal 335 is Z0. From this viewpoint, the electric powers input to the input terminals 1 of the amplifiers are amplified by the amplifiers 2, combined without any loss caused by the impedance mismatching within the power combiner, and the combined power is output from the third combination side terminal 335.

Figure 10:
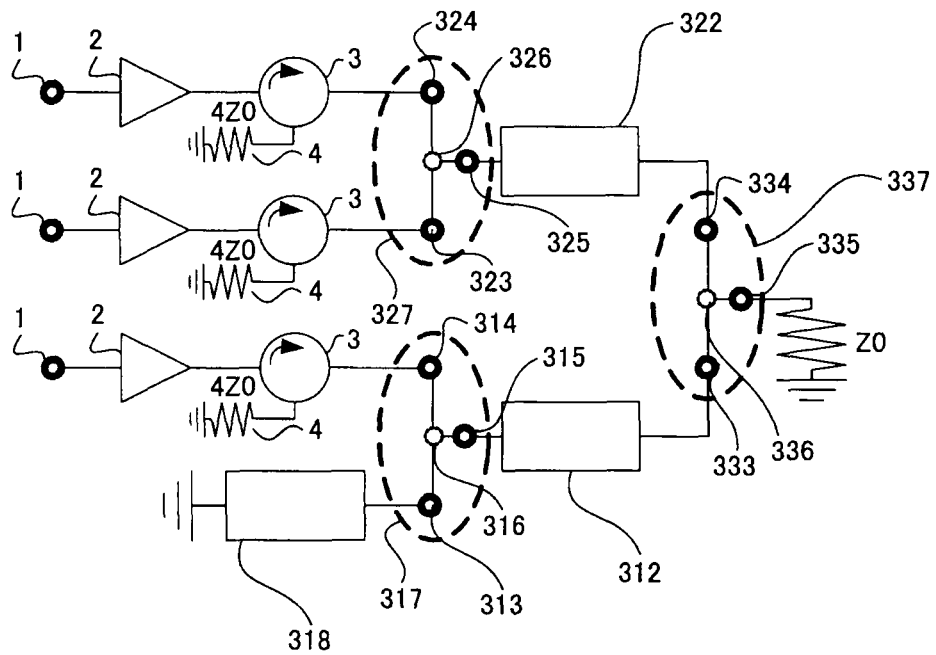
FIG. 10 is a circuit diagram of the power combiner according to the third embodiment of the present invention, in which an amplifier connected to a third branch side terminal fails.

Next, there is considered a case in which, among the plurality of amplifiers connected to the power combiner according to the third embodiment of the present invention, the amplifier connected to the third branch side terminal 313 fails, and the signals are input only from the third branch side terminals 314, 323, and 324. FIG. 10 is a circuit diagram of the power combiner according to the third embodiment of the present invention, in which the amplifier connected to the third branch side terminal 313 fails. FIG. 10 illustrates a state in which, when the above-mentioned failure occurs, the failed amplifier is removed, and the third branch side terminal 313 is terminated with a third termination line 318 having a leading end short-circuited, the impedance of 4Z0, and the electrical length of an odd multiple of ¼ wavelength. The third termination line 318 corresponds to the impedance opening means.

The amplifiers connected to the third branch circuit 327 operate in the normal state, and hence the impedance of the third combination side terminal 325 becomes 2Z0. Both of the impedance of the third connection line 322 and the impedance of the third combination side terminal 325 are 2Z0, and hence the impedance of the third branch side terminal 334 becomes 2Z0. Accordingly, the impedance of the third branch side terminal 334 side at the third power combination point 336 becomes 2Z0.

The electrical length of the third termination line 318 is equal to an odd multiple of ¼ wavelength, and hence the impedance of the third branch side terminal 313 side at the third power combination point 316 is opened. On the other hand, the impedance of the third branch side terminal 314 side at the third power combination point 316 side becomes 4Z0. Accordingly, the impedance of the third power combination point 316 side at the third combination side terminal 315 becomes 4Z0.

The third connection line 312 has an electrical length equal to an integral multiple of ½ wavelength. Accordingly, the impedance of the third branch side terminal 333 side at the third power combination point 336 becomes 4Z0.

That is, the impedance of the third branch side terminal 333 side at the third power combination point 336 is 4Z0, and the impedance of the third branch side terminal 334 side at the third power combination point 336 is 2Z0. Accordingly, the third branch circuit 337 is a branch circuit that combines together the electric power from the third branch side terminal 333 side and the electric power from the third branch side terminal 334 side at a ratio of 1:2.

On the other hand, the electric power input from the third branch side terminal 333 side is an electric power from the amplifier connected to the third branch side terminal 314, and the signal input from the third branch side terminal 334 side is a combined electric power from the two amplifiers connected to the third branch side terminals 323 and 324. From this viewpoint, the ratio of the electric power from the third branch side terminal 333 side and the electric power from the third branch side terminal 334 side is 1:2. As a result, the electric powers are combined together without any loss caused by the impedance mismatching within the power combiner, and the combined power is output from the third combination side terminal 335.

As described above, according to the power combiner of the third embodiment, when the amplifiers that operate in parallel operate normally, the electric powers can be combined together without any combination loss caused by the impedance mismatching within the power combiner. Further, even when a part of the amplifiers that operate in parallel fail, the third branch side terminal connected to the failed amplifier is terminated with the termination line so that the electric powers can be combined together without any combination loss caused by the impedance mismatching within the power combiner.

Further, in the third embodiment, a case in which only the amplifier connected to the third branch side terminal 313 fails is described. However, the present invention is not limited to this case, and even if the plurality of amplifiers connected to the third branch side terminals fail, the third branch side terminals connected to the failed amplifiers are terminated with the third termination line 318 to obtain the same effects.

Figure 11:
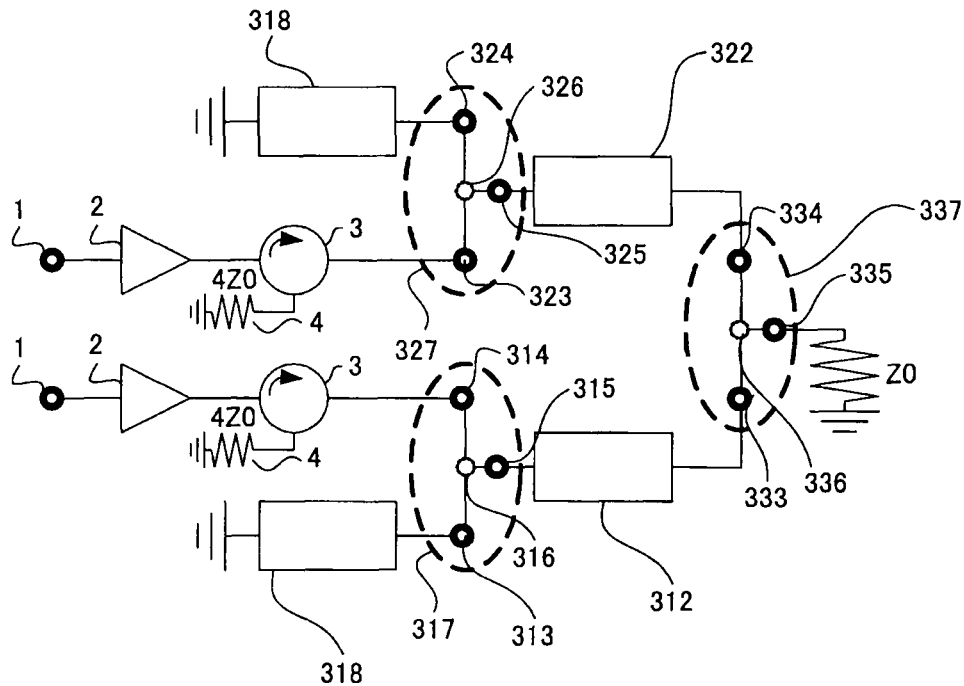
FIG. 11 is a circuit diagram of the power combiner according to the third embodiment of the present invention, in which respective amplifiers connected to two third branch side terminals fail.

FIG. 11 is a circuit diagram of the power combiner according to the third embodiment of the present invention, in which two amplifiers connected to the third branch side terminal 313 and the third branch side terminal 324 fail. FIG. 11 illustrates a state in which, when the above-mentioned failure occurs, both of the failed two amplifiers are removed from the power combiner, and the third branch side terminal 313 and the third branch side terminal 324 are each terminated with the third termination line 318. In this way, even when two or more amplifiers fail, the third branch side terminals connected to the failed amplifiers are each terminated with the third termination line 318 to obtain the same effects.

Further, in the third embodiment, during the normal operation of the amplifiers connected in parallel, the load impedances connected to the third branch side terminals 313, 314, 323, 324, 333, and 334 are set to 4Z0, and the load impedance connected to the third combination side terminal 335 is set to Z0. However, the present invention is not limited to this configuration, and the respective load impedances may be arbitrary values. Note that, the circuit within the power combiner is designed to have a value causing no impedance mismatching during the normal operation of the amplifiers connected in parallel.

Further, in the third embodiment, the three third branch circuits are connected in a tournament fashion. However, the present invention is not limited to this configuration, and applicable to other configurations if the two third branch circuits are connected by the third connection line. For example, the present invention is applicable to a configuration in which $2^n-1$ (n is a natural number) third branch circuits are connected in a tournament fashion, or a configuration in which $2^n-1$ third branch circuits are connected in series.

Further, in the third embodiment, the third branch circuits 317, 327, and 337 each having two third branch side terminals and one third combination side terminal are connected in the tournament fashion. However, the present invention is not limited to this configuration, and a part or all of the third branch circuits may be each configured by a third branch circuit having K third branch side terminals (K is an integer of two or more) and one third combination side terminal.

Further, in the third embodiment, when the amplifier connected to the third branch side terminal 313 fails, the third branch side terminal 313 is terminated with the third termination line 318 having a leading end short-circuited and the electrical length of the odd multiple of ¼ wavelength. However, the present invention is not limited to this configuration, and the third branch side terminal 313 where the amplifier fails may be terminated with total reflection, for example, with a line having a leading end opened to the third branch side terminal 313 and the electrical length of the integral multiple of ½ wavelength, so that the impedance of the third branch side terminal 313 side at the third power combination point 316 becomes infinite.

Further, in the third embodiment, a case in which the amplifier connected to the third branch side terminal 313 fails is described. However, the present invention is not limited to this case, and even when the amplifiers connected to terminals other than the third branch side terminal 313 fail, the respective third branch side terminals connected to the failed amplifiers are terminated with the third termination lines, thereby obtaining the same effects.

Further, in the third embodiment, when the amplifier connected to the third branch side terminal 313 fails, the impedance of the third combination side terminal 335 becomes 4/3Z0 because the impedance of 4Z0 of the third branch side terminal 333 side at the third power combination point 336 and the impedance of 2Z0 of the third branch side terminal 334 side at the third power combination point 336 are connected in parallel.

Figure 12:
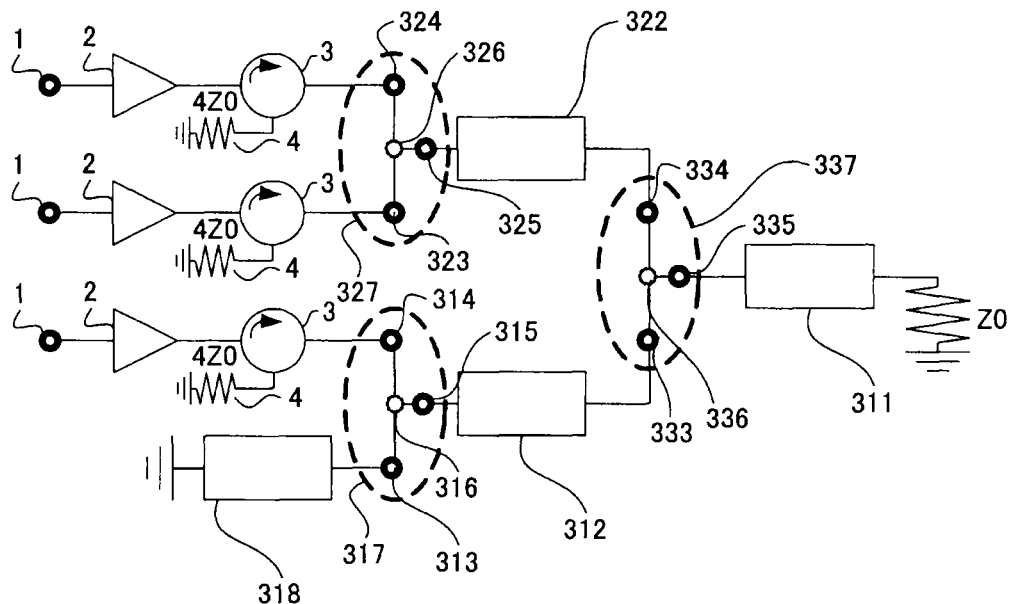
FIG. 12 is a circuit diagram of the power combiner according to the third embodiment of the present invention, in which the reflection loss is set to 0 when the amplifier connected to the third branch side terminal fails.

On the other hand, the load impedance connected to the third combination side terminal 335 is Z0, and hence the impedance mismatching occurs in the third combination side terminal 335, resulting in a reflection loss. FIG. 12 is a circuit diagram of the power combiner according to the third embodiment of the present invention, in which the reflection loss is set to 0 when the amplifier connected to the third branch side terminal 313 fails. As illustrated in FIG. 12, the reflection loss can be set to 0 by realizing the impedance matching at the third combination side terminal 335, by connecting, to the third combination side terminal 335, a third matching impedance transformer 311 that is a line having an electrical length equal to an odd multiple of ¼ wavelength and an impedance represented by the above Expression (2).

Note that, in FIG. 12, the third matching impedance transformer 311 is connected to the third power combination point 336. However, the present invention is not limited to this configuration, and as the impedance where the reflection loss becomes 0, the third matching impedance transformers 311 may be connected between the third branch side terminals 313, 314, 323, and 324, and the circulators 3, respectively.

Further, in the third embodiment, the third matching impedance transformer 311 is configured by an impedance transformer that is a line having the electrical length of the odd multiple of ¼ wavelength and the impedance represented by the above Expression (2). However, the present invention is not limited to this configuration, and the same effects are obtained by connecting an impedance transformer that matches the impedance mismatching at the third combination side terminal 335. Alternatively, the same effects are obtained by changing the impedance of the third impedance transformer or the impedance of the third connection line so as to match the impedance mismatching at the third combination side terminal 335.

Further, in the third embodiment, a case in which the electric powers of the plurality of amplifiers that operate in parallel are combined together is described. However, the present invention is not limited to this case, and the same effects are obtained even when electric powers from a plurality of antennas are combined together. Further, in the third embodiment, the power combiner that combines the electric powers together is described. However, the same effects are obtained even when the present invention is used as a power divider that divides the electric power.

Fourth Embodiment

Figure 13:
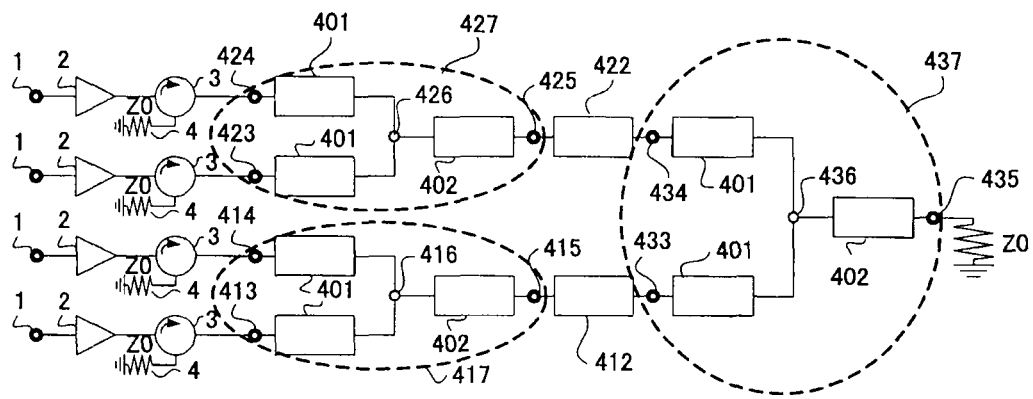
FIG. 13 is a circuit diagram of a power combiner according to a fourth embodiment of the present invention.

FIG. 13 is a circuit diagram of a power combiner according to a fourth embodiment of the present invention. The power combiner according to the fourth embodiment illustrated in FIG. 13 includes fourth impedance transformers 401, fifth impedance transformers 402, fourth connection lines 412 and 422, fourth branch side terminals 413, 414, 423, 424, 433, and 434, fourth combination side terminals 415, 425, and 435, and fourth power combination points 416, 426, and 436. Each of the fourth connection lines 412 and 422 has an electrical length equal to an integral multiple of about ½ wavelength.

The power combiner/distributor illustrated in FIG. 13 has three fourth branch circuits 417, 427, and 437 (corresponding to portions indicated by dotted circles of FIG. 13), and the three fourth branch circuits 417, 427, and 437 are connected through the fourth connection lines 412 and 422 in a tournament fashion. The fourth branch circuit 417 includes the fourth impedance transformers 401, the fifth impedance transformer 402, the fourth branch side terminals 413 and 414, the fourth combination side terminal 415, and the fourth power combination point 416.

Further, the fourth branch circuit 427 includes the fourth impedance transformers 401, the fifth impedance transformer 402, the fourth branch side terminals 423 and 424, the fourth combination side terminal 425, and the fourth power combination point 426. Further, the fourth branch circuit 437 includes the fourth impedance transformers 401, the fifth impedance transformer 402, the fourth branch side terminals 433 and 434, the fourth combination side terminal 435, and the fourth power combination point 436. The fourth impedance transformers 401 and the fifth impedance transformers 402 used within the three fourth branch circuits 417, 427, and 437 correspond to the impedance opening means.

Further, an input part provided at the pre-stage of the fourth branch circuits 417 and 427 includes the input terminals 1, the amplifiers 2, the circulators 3, and the termination resistors 4.

In this embodiment, it is assumed that the impedances of the input terminal 1 side at the fourth branch side terminals 413, 414, 423, 424, 433, and 434, the load impedance connected to the fourth combination side terminal 435, and the impedances of the fourth connection lines 412 and 422 are the same value of Z0.

That is, when it is assumed that the fourth impedance transformer 401 is a line having the electrical length of the odd multiple of ¼ wavelength and the impedance of aZ0 (a>0, arbitrary constant), the fifth impedance transformer is a line having the electrical length of the odd multiple of ¼ wavelength and the impedance represented by the following Expression (9) so that the respective impedances of the fourth power combination points 416, 426, and 436 side at the fourth combination side terminals 415, 425, and 435 become Z0. Accordingly, the electrical length between the fourth power combination point 416 and the fourth power combination point 436 and the electrical length between the fourth power combination point 426 and the fourth power combination point 436 each become an integral multiple of ½ wavelength.

[Ex. 9]

$$Z_{t3} = \frac{aZ_0}{\sqrt{2}} \quad (9)$$

Next, operation of the power combiner according to the fourth embodiment of the present invention is described. First, a case in which all of the plurality of amplifiers connected to the power combiner according to the fourth embodiment of the present invention operate normally is considered. It is assumed that the same signals are input to the input terminals 1 of the respective amplifiers, the input electric powers are amplified by the respective amplifiers 2, and the amplified electric powers are input to the respective fourth branch side terminals 413, 414, 423, and 424 as signals having the same amplitude phase.

The load impedances connected to the fourth branch side terminals 413, 414, 423, and 424 are Z0. The respective impedances of the fourth branch side terminals 413 and 414 side at the fourth power combination point 416 are $a^2Z0$ because the load impedances connected to the fourth branch side terminals 413 and 414 are transformed by the fourth impedance transformer 401, respectively. Accordingly, the combination impedance of the fourth branch side terminals 413 and 414 at the fourth power combination point 416 becomes $a^2Z0/2$ because $a^2Z0$ is connected in parallel.

The impedance of the fourth power combination point 416 side at the fourth combination side terminal 415 becomes Z0 because the impedance of $a^2Z0/2$ at the fourth power combination point 416 is transformed by the fifth impedance transformer 402.

On the other hand, the impedance of the fourth connection line 412 connected to the fourth combination side terminal 415 is Z0. Further, the impedance of the fourth power combination point 416 side at the fourth combination side terminal 415 is Z0, and the impedance of the fourth connection line 412 is Z0. Therefore, the impedance of the fourth connection line 412 side at the fourth branch side terminal 433 becomes Z0.

The operation of the fourth branch circuit 417 and the operation of the fourth branch circuit 427 are the same as each other, and hence the impedance of the fourth connection line 422 side at the fourth branch side terminal 434 is also Z0. Further, the operation of the fourth branch circuit 417 and the operation of the fourth branch circuit 437 are the same as each other, and hence the impedance of the fourth power combination point 436 side at the fourth combination side terminal 435 is also Z0.

From the above viewpoint, the signals input to the input terminals 1 of the amplifiers are amplified by the amplifiers 2, input to the fourth branch side terminals 413, 414, 423, and 424, combined together without any loss caused by the impedance mismatching within the power combiner, and the combined power is output from the fourth combination side terminal 435.

Figure 14:
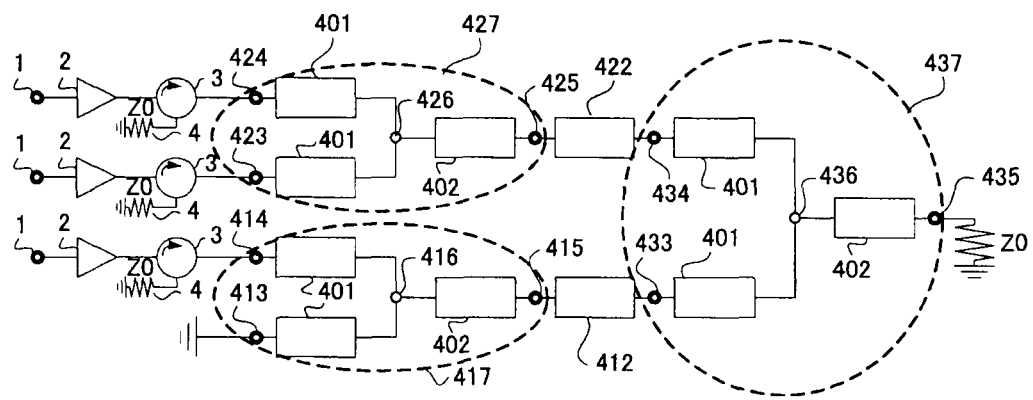
FIG. 14 is a circuit diagram of the power combiner according to the fourth embodiment of the present invention, in which an amplifier connected to a fourth branch side terminal fails.

Next, there is considered a case in which the amplifier connected to the fourth branch side terminal 413 fails among the plurality of amplifiers connected to the power combiner according to the fourth embodiment of the present invention and the signals are input only from the fourth branch side terminals 414, 423, and 424. FIG. 14 is a circuit diagram of the power combiner according to the fourth embodiment of the present invention, in which the amplifier connected to the fourth branch side terminal 413 fails. FIG. 14 illustrates a state in which, when the above-mentioned failure occurs, the failed amplifier is removed from the power combiner and the fourth branch side terminal 413 is short-circuited.

The amplifiers connected to the fourth branch circuit 427 operate in the normal state, and hence the impedance of the fourth branch side terminal 434 side at the fourth power combination point 436 becomes $a^2Z0$.

The fourth branch side terminal 413 is short-circuited, and hence the impedance of the forth branch side terminal 413 side at the fourth power combination point 416 is opened. On the other hand, the impedance of the fourth branch side terminal 414 side at the fourth power combination point 416 becomes $a^2Z0$. Accordingly, the combination impedance of the fourth branch side terminals 413 and 414 side at the fourth power combination point 416 becomes $a^2Z0$.

The combination impedance of $a^2Z0$ of the fourth branch side terminals 413 and 414 side at the fourth power combination point 416 is transformed by the fifth impedance transformer 402, and hence the impedance of the fourth power combination point 416 side at the fourth combination side terminal 415 becomes Z0/2.

The fourth connection line 412 has the impedance of Z0 and the electrical length of the integral multiple of ½ wavelength. Accordingly, the impedance of the fourth branch circuit 417 side at the fourth branch side terminal 433 becomes Z0/2. The impedance of Z0/2 of the fourth branch circuit 417 side at the fourth branch side terminal 433 is transformed by the fourth impedance transformer 401, and hence the impedance of the fourth branch side terminal 433 side at the fourth power combination point 436 becomes $2a^2Z0$.

That is, the impedance of the fourth branch side terminal 433 side at the fourth power combination point 436 is $2a^2Z0$, and the impedance of the fourth branch side terminal 434 side at the fourth power combination point 436 is $a^2Z0$. Accordingly, the fourth branch circuit 437 is a branch circuit that combines the electric powers together without impedance mismatching when the electric power from the fourth branch side terminal 433 side and the electric power from the fourth branch side terminal 434 side are combined together at a ratio of 1:2.

On the other hand, the signal input from the fourth branch side terminal 433 side is only an electric power from the amplifier connected to the fourth branch side terminal 414, and the signal input from the fourth branch side terminal 434 side is a combined electric power from the two amplifiers connected to the fourth branch side terminals 423 and 424. From this viewpoint, the ratio of the electric power from the fourth branch side terminal 433 side and the electric power from the fourth branch side terminal 434 side is 1:2. As a result, the electric powers are combined together without any loss caused by the impedance mismatching within the power combiner, and the combined power is output from the fourth combination side terminal 435.

As described above, according to the power combiner of the fourth embodiment, when the amplifiers that operate in parallel operate normally, the electric powers can be combined together without any combination loss caused by the impedance mismatching within the power combiner. Further, even when a part of the amplifiers that operate in parallel fail, the fourth branch side terminal connected to the failed amplifier is short-circuited so that the electric powers can be combined together without any combination loss caused by the impedance mismatching within the power combiner.

Note that, in the fourth embodiment, the fourth impedance transformer is the line having the impedance of aZ0, and the fifth impedance transformer is configured by the line having the impedance represented by the above Expression (9) and the electrical length of the odd multiple of ¼ wavelength. However, the present invention is not limited to this configuration, and may be configured by impedance transformers, such as impedance transformers different in impedance in which ¼ wavelength are cascade-connected in series with each other or impedance transformers using tapered lines, which can realize the impedance matching at the fourth branch circuits 417, 427, and 437 when the amplifiers operate normally. Further, the length of the fourth connection line may be determined so that the electrical length between the fourth power combination point 416 and the fourth power combination point 436 and the electrical length between the fourth power combination point 426 and the fourth power combination point 436 each become the integral multiple of ½ wavelength.

Further, in the fourth embodiment, a case in which only the amplifier connected to the fourth branch side terminal 413 fails is described. However, the present invention is not limited to this case, and even if a plurality of amplifiers connected to the fourth branch side terminals fail, the terminals connected to the failed amplifiers are short-circuited to obtain the same effects.

Figure 15:
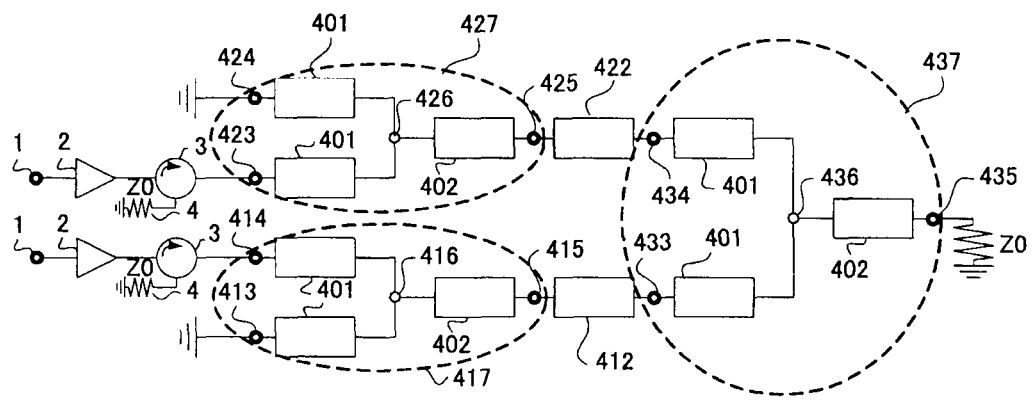
FIG. 15 is a circuit diagram of the power combiner according to the fourth embodiment of the present invention, in which respective amplifiers connected to two fourth branch side terminals fail.

FIG. 15 is a circuit diagram of the power combiner according to the fourth embodiment of the present invention, in which two amplifiers connected to the fourth branch side terminal 413 and the fourth branch side terminal 424 fail. FIG. 15 illustrates a state in which, when the above-mentioned failure occurs, both of the failed two amplifiers are removed from the power combiner, and the fourth branch side terminal 413 and the fourth branch side terminal 424 are so terminated as to be short-circuited. In this way, even when two or more amplifiers fail, the respective fourth branch side terminals connected to the failed amplifiers are short-circuited to obtain the same effects.

Further, in the fourth embodiment, when the amplifiers connected in parallel operate normally, all of the impedances of the circuits connected to the fourth branch side terminals 413, 414, 423, 424, 433, and 434, and the fourth combination side terminal 435 are the same as each other. However, the present invention is not limited to this configuration, and the respective load impedances may be arbitrary values. Note that, the circuits within the power combiner are designed to have such values that no impedance mismatching occurs when the amplifiers connected in parallel operate normally.

In the fourth embodiment, the three fourth branch circuits are connected in a tournament fashion. However, the present invention is not limited to this configuration, and applicable to other configurations if the two fourth branch circuits are connected by the fourth connection line. For example, $2^n-1$ (n is a natural number) fourth branch circuits are connected in a tournament fashion, or are connected in series.

Further, in the fourth embodiment, the fourth branch circuits 417, 427, and 437 each having two fourth branch side terminals and one fourth combination side terminal are connected in the tournament fashion. However, the present invention is not limited to this configuration, and a part or all of the fourth branch circuits may be each configured by a fourth branch circuit having K fourth branch side terminals (K is an integer of two or more) and one fourth combination side terminal.

Further, in the fourth embodiment, when the amplifier connected to the fourth branch side terminal 413 fails, the fourth branch side terminal 414 is short-circuited. However, the present invention is not limited to this configuration, and the fourth branch side terminal 413 where the amplifier fails may be terminated with total reflection, for example, with a line having a leading end opened to the fourth branch side terminal 413 and the electrical length of the odd multiple of ¼ wavelength or a line having a leading end short-circuited to the fourth branch side terminal 413 and the electrical length of ½ wavelength, so that the impedance of the fourth branch side terminal 413 side at the fourth power combination point 416 becomes infinite.

Further, in the fourth embodiment, a case in which the amplifier connected to the fourth branch side terminal 413 fails is described. However, the present invention is not limited to this case, and even when the amplifiers connected to terminals other than the fourth branch side terminal 413 fail, the respective second branch side terminals connected to the failed amplifiers are short-circuited, thereby obtaining the same effects.

Further, in the fourth embodiment, when the amplifier connected to the fourth branch side terminal 413 fails, the impedance of the fourth combination side terminal 435 becomes $\frac{2}{3}a^2Z0$ because the impedance $2a^2Z0$ of the fourth branch side terminal 433 side at the fourth power combination point 436 and the impedance $a^2Z0$ of the fourth branch side terminal 434 side at the fourth power combination point 436 are connected in parallel.

The impedance is transformed by the fifth impedance transformer 402, and the impedance of the fourth impedance transformer 401 side at the fourth combination side terminal 435 becomes ¾Z0.

Figure 16:
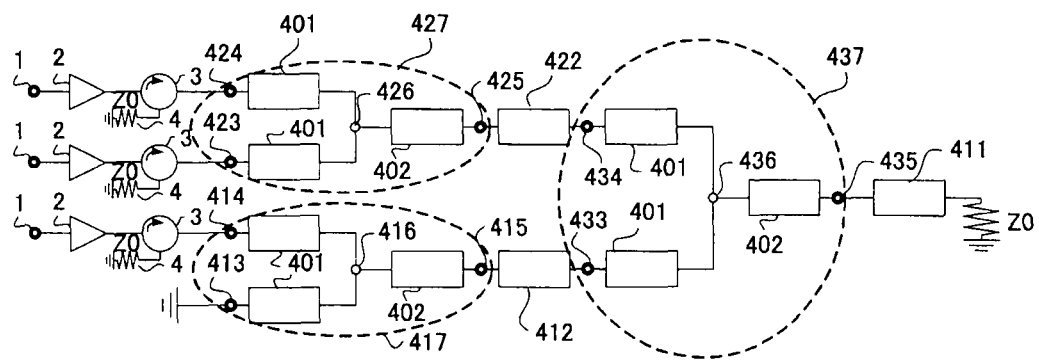
FIG. 16 is a circuit diagram of the power combiner according to the fourth embodiment of the present invention, in which the reflection loss is set to 0 when the amplifier connected to the fourth branch side terminal fails.

On the other hand, the load impedance connected to the fourth combination side terminal 435 is Z0, and hence the impedance mismatching occurs in the fourth combination side terminal 435, resulting in a reflection loss. FIG. 16 is a circuit diagram of the power combiner according to the fourth embodiment of the present invention, in which the reflection loss is set to 0 when the amplifier connected to the fourth branch side terminal 413 fails. As illustrated in FIG. 16, the reflection loss can be set to 0 by realizing the impedance matching at the fourth combination side terminal 435 by connecting, to the fourth combination side terminal 435, a fourth matching impedance transformer 411 that is a line having an electrical length equal to an odd multiple of ¼ wavelength and an impedance represented by the above Expression (6).

Note that, in FIG. 16, the fourth matching impedance transformer 411 is connected to the fourth combination side terminal 435. However, the present invention is not limited to this configuration, and as the impedance where the reflection loss becomes 0, the fourth matching impedance transformers 411 may be connected between the fourth branch side terminals 413, 414, 423, and 424, and the circulators 3, respectively.

Further, in the fourth embodiment, the fourth matching impedance transformer 411 is configured by an impedance transformer that is a line having the electrical length of the odd multiple of ¼ wavelength and the impedance represented by the above Expression (6). However, the present invention is not limited to this configuration, and the same effects are obtained by connecting an impedance transformer that matches the impedance mismatching at the fourth combination side terminal 435. Alternatively, the same effects are obtained by changing the impedance of the fourth impedance transformer, the impedance of the fifth impedance transformer, or the impedance of the fourth connection line so as to match the impedance mismatching at the fourth combination side terminal 435.

Further, in the fourth embodiment, a case in which the electric powers from the plurality of amplifiers that operate in parallel are combined together is described. However, the present invention is not limited to this case, and the same effects are obtained even when electric powers from a plurality of antennas are combined together. Further, in the fourth embodiment, the power combiner that combines the electric powers together is described. However, the same effects are obtained even when the present invention is used as a power divider that divides the electric power electric power.

Fifth Embodiment

Figure 17:
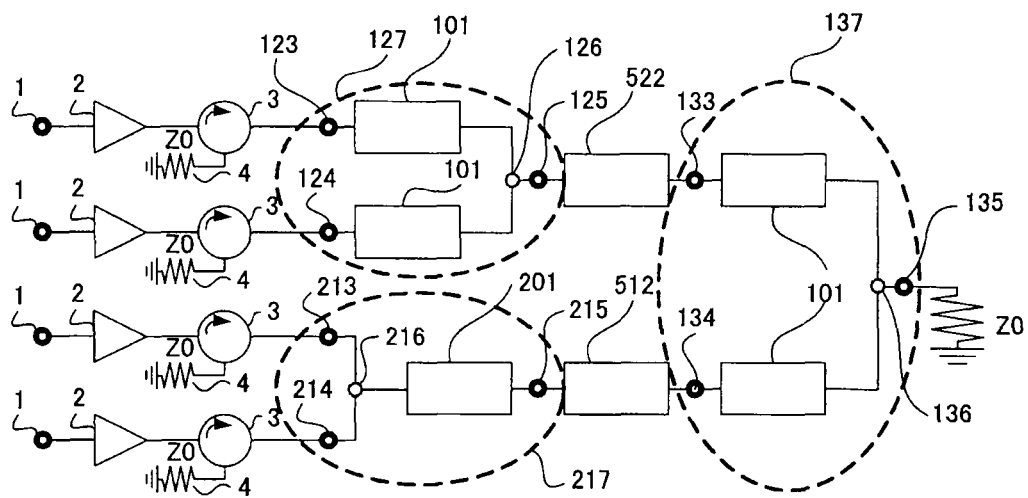
FIG. 17 is a circuit diagram of a power combiner according to a fifth embodiment of the present invention.

FIG. 17 is a circuit diagram of a power combiner according to a fifth embodiment of the present invention. The power combiner according to the fifth embodiment illustrated in FIG. 17 is configured by tournament connection of three branch circuits including the first branch circuits 127 and 137 and the second branch circuit 217. A fifth connection line 512 that connects the second branch circuit 217 and the first branch circuit 137 is a line having the impedance of Z0 and the electrical length of the integral multiple of ½ wavelength. Further, a fifth connection line 522 that connects the first branch circuit 127 and the first branch circuit 137 is a line having the impedance of Z0 and the electrical length of the odd multiple of ¼ wavelength.

Next, the operation of the power combiner/distributor according to the fifth embodiment of the present invention is described. First, there is considered a case in which all of the plurality of amplifiers connected to the power combiner according to the fifth embodiment of the present invention operate normally, and signals are input from the first branch side terminals 123 and 124, and the second branch side terminals 213 and 214. The first branch circuit 127 operates in the same manner as that of the above first embodiment, and the second branch circuit 217 operates in the same manner as that of the above second embodiment. For that reason, the signals from the first branch side terminals 123, 124 and the second branch side terminals 213, 214 are combined together without any loss caused by the impedance mismatching. The combined signal is output from the first combination side terminal 135, and is output to a load connected to the first combination side terminal 135.

Figure 18:
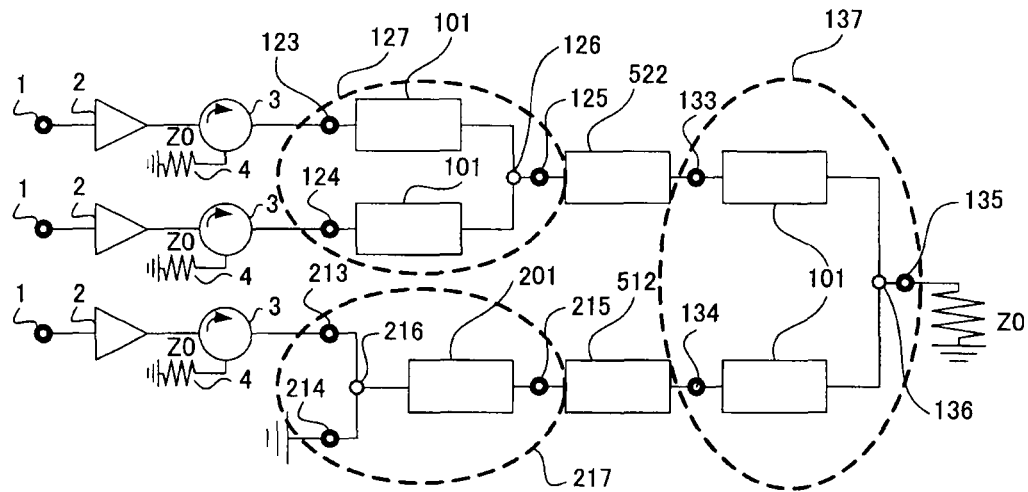
FIG. 18 is a circuit diagram of the power combiner according to the fifth embodiment of the present invention, in which an amplifier connected to a second branch side terminal fails.

Next, there is considered a case in which, among the plurality of amplifiers connected to the power combiner according to the fifth embodiment of the present invention, the amplifier connected to the second branch side terminal 214 fails, and signals are input only from the second branch side terminal 213, and the first branch side terminals 123 and 224. FIG. 18 is a circuit diagram of the power combiner according to the fifth embodiment of the present invention, in which the amplifier connected to the second branch side terminal 214 fails. FIG. 18 illustrates a state in which, when the above-mentioned failure occurs, the failed amplifier is removed from the power combiner, and the second branch side terminal 214 is short-circuited.

The amplifiers connected to the first branch circuit 127 operate in the normal state, and hence the impedance of the first branch side terminal 133 side at the first power combination point 136 becomes 2Z0.

The second branch side terminal 214 is short-circuited, and hence the impedance of the second power combination point 216 side at the second combination side terminal 215 becomes Z0/2 as in the above second embodiment. The fifth connection line 512 is a line having the electrical length of the integral multiple of ½ wavelength, and hence the impedance of the fifth connection line 512 side at the first branch side terminal 134 becomes Z0/2.

The impedance Z0/2 of the fifth connection line 512 at the first branch side terminal 134 is transformed by the first impedance transformer 101, and hence the impedance of the first branch side terminal 134 side at the first power combination point 146 becomes 4Z0.

That is, the impedance of the first branch side terminal 133 side at the first power combination point 136 is 2Z0, and the impedance of the first branch side terminal 134 side at the first power combination point 136 is 4Z0. Accordingly, the first branch circuit 137 is a branch circuit that combines the electric power from the first branch side terminal 133 side and the electric power from the first branch side terminal 134 side together at a ratio of 2:1.

On the other hand, the signal input from the first branch side terminal 134 side is electric power from the amplifier connected to the second branch side terminal 213, and the signal input from the first branch side terminal 133 side is a combined electric power from the two amplifiers connected to the first branch side terminals 123 and 124. From this viewpoint, the ratio of the electric power from the first branch side terminal 133 side and the electric power from the first branch side terminal 134 side is 2:1. As a result, the electric powers are combined together without any loss caused by the impedance mismatching within the power combiner, and the combined power is output from the first combination side terminal 135.

As described above, according to the power combiner of the fifth embodiment, when the amplifiers that operate in parallel operate normally, the electric powers can be combined together without any combination loss caused by the impedance mismatching within the power combiner. Further, even when a part of the amplifiers that operate in parallel fail, the first branch side terminal connected to the failed amplifier is short-circuited so that the electric powers can be combined together without any combination loss caused by the impedance mismatching within the power combiner.

Note that, in the fifth embodiment, the first branch circuits and the second branch circuit are configured by tournament connection. However, the present invention is not limited to this configuration, and the plurality of first branch circuits, second branch circuits, third branch circuits, and fourth branch circuits may be configured in an arbitrary combination, as described in the above-mentioned first to fourth embodiments.

In that case, the length of the connection line is determined so that the length between the power combination points of the branch circuits connected through the connection line becomes the integral multiple of ½ wavelength. It is sufficient that the impedances of the respective connection lines be set to realize the impedance matching at all of the portions within the power combiner when the amplifiers operate normally.

Further, in the fifth embodiment, a case in which only the amplifier connected to the second branch side terminal 214 fails is described. However, the present invention is not limited to this case, and even if two or more amplifiers connected to the second branch side terminals fail, the branch side terminals connected to the failed amplifiers are short-circuited to obtain the same effects.

Figure 19:
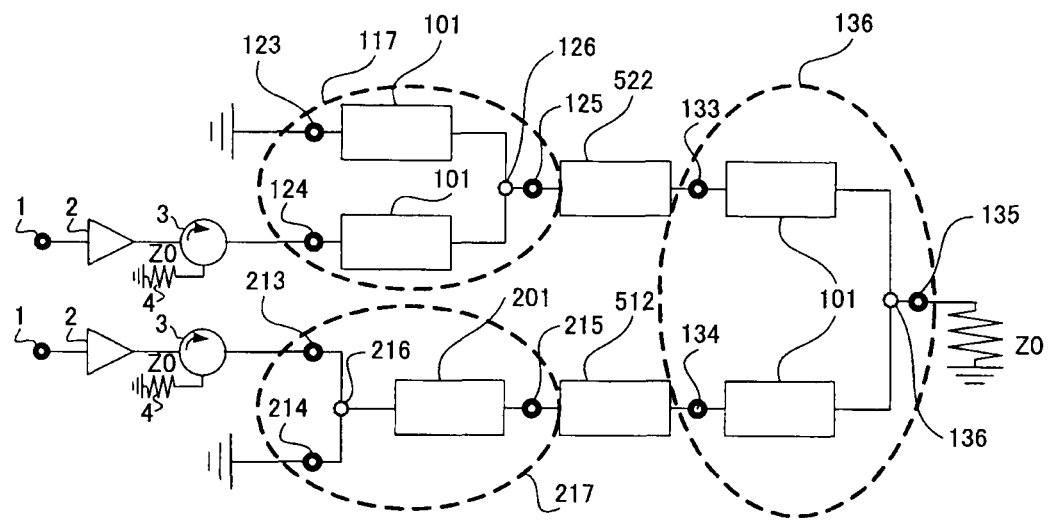
FIG. 19 is a circuit diagram of the power combiner according to the fifth embodiment of the present invention, in which two amplifiers connected to the second branch side terminal and the first branch side terminal fail.

FIG. 19 is a circuit diagram of the power combiner according to the fifth embodiment of the present invention, in which two amplifiers connected to the second branch side terminal 214 and the first branch side terminal 123 fail. FIG. 19 illustrates a state in which, when the above-mentioned failure occurs, both of the failed two amplifiers are removed from the power combiner, and the second branch side terminal 214 and the first branch side terminal 123 are so terminated as to be short-circuited. In this way, even when two or more amplifiers fail, the respective first branch side terminals and second branch side terminals connected to the failed amplifiers are short-circuited to obtain the same effects.

Further, in the fifth embodiment, when the amplifiers connected in parallel operate normally, all of the impedances of the circuits connected to the first branch side terminals 123, 124, 133, and 134, the second branch side terminals 213 and 134, and the first combination side terminal 135 are the same as each other. However, the present invention is not limited to this case, and the respective load impedances may be arbitrary values. Note that, the circuits within the power combiner are designed to have such values that no impedance mismatching occurs when the amplifiers connected in parallel operate normally.

Further, in the fifth embodiment, the impedance of the first power combination point 136 side at the first combination side terminal 135 becomes ⅘Z0 as in the first embodiment. On the other hand, because the load impedance connected to the first combination side terminal 135 becomes Z0, the impedance mismatching occurs in the first combination side terminal 135, causing the reflection loss.

Figure 20:
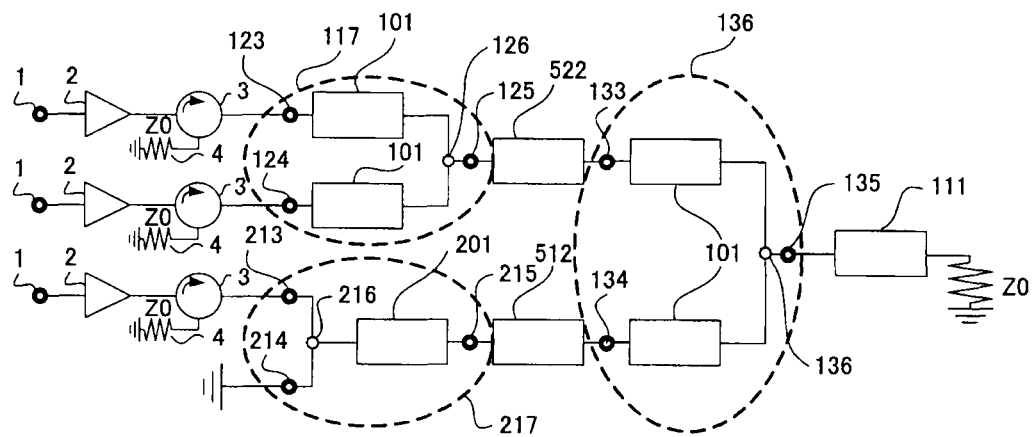
FIG. 20 is a circuit diagram of the power combiner according to the fifth embodiment of the present invention, in which the reflection loss is set to 0 when the amplifier connected to the second branch side terminal fails.

FIG. 20 is a circuit diagram of the power combiner according to the fifth embodiment of the present invention, in which the reflection loss is set to 0 when the amplifier connected to the second branch side terminal 214 fails. As in the above first embodiment, as illustrated in FIG. 20, the first matching impedance transformer 111 is connected to the first combination side terminal 135, and the impedance matching is realized by the first combination side terminal 135 so as to set the reflection loss to 0.

Note that, in FIG. 20, the first matching impedance transformer 111 is connected to the first power combination point 136. However, the present invention is not limited to this configuration, and as the impedance where the reflection loss becomes 0, the first matching impedance transformers 111 may be connected between the first branch side terminals 123 and 124 and the second branch side terminals 213 and 134, and the circulators 3, respectively.

Further, in the fifth embodiment, the first matching impedance transformer 111 is provided. However, the present invention is not limited to this configuration, and the impedance of the first impedance transformer or the impedance of the first connection line is changed so as to connect the impedance transformer that matches the impedance mismatching at the first combination side terminal 135, or match the impedance mismatching at the first combination side terminal 135, thereby obtaining the same effects.

Further, in the fifth embodiment, a case in which the electric powers of the plurality of amplifiers that operate in parallel are combined together is described. However, the present invention is not limited to this case, and the same effects are obtained even when electric powers from a plurality of antennas are combined together. Further, in the fifth embodiment, the power combiner that combines the electric powers together is described. However, the same effects are obtained even when the present invention is used as a power divider that divides the electric power.

Sixth Embodiment

Figure 21:
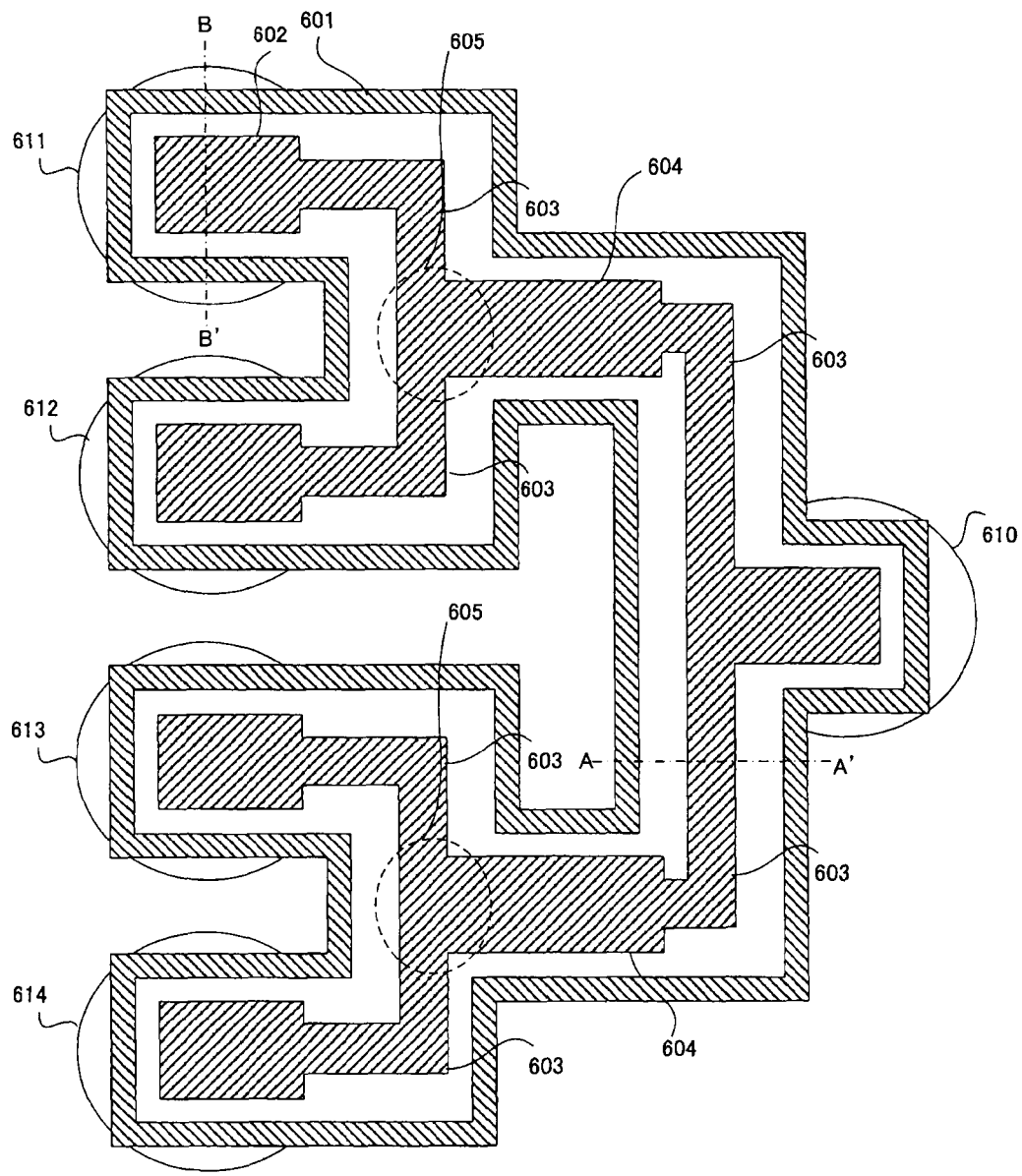
FIG. 21 is a top view of a power combiner according to a sixth embodiment of the present invention, in which the power combiner uses a rectangular coaxial line.
Figure 22:
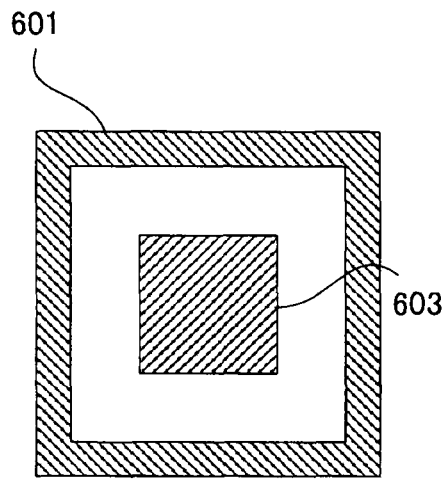
FIG. 22 is a cross-sectional view of the power combiner according to the sixth embodiment of the present invention, taken along the line A-A' of FIG. 21.
Figure 23:
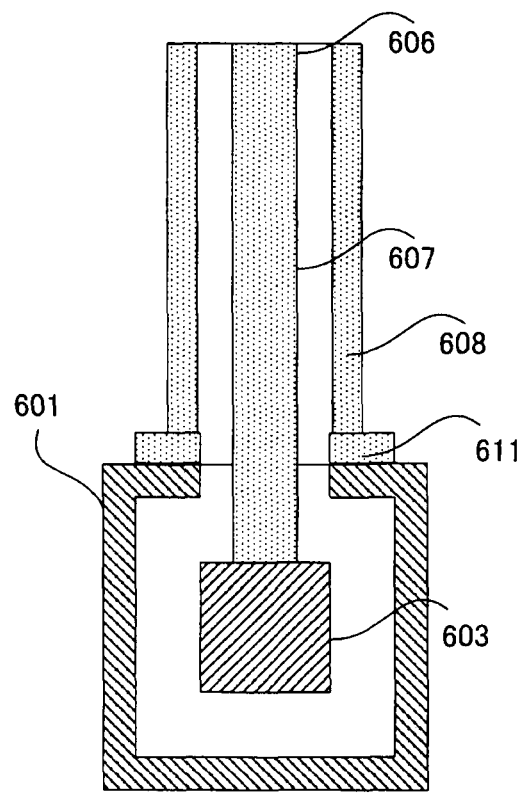
FIG. 23 is a cross-sectional view of the power combiner according to the sixth embodiment of the present invention, taken along the line B-B' of FIG. 21.

FIG. 21 is a top view of a power combiner according to a sixth embodiment of the present invention, in which the power combiner uses a rectangular coaxial line. FIG. 22 is a cross-sectional view of the power combiner according to the sixth embodiment of the present invention, taken along the line A-A' of FIG. 21. FIG. 23 is a cross-sectional view of the power combiner according to the sixth embodiment of the present invention, taken along the line B-B' of FIG. 21.

The respective reference numerals in FIGS. 21 to 23 indicate the following components.

601: outer conductor of a rectangular coaxial line
602: inner conductor of the rectangular coaxial line having an impedance of Z0
603: inner conductor of a sixth impedance transformer having the impedance represented by the following Expression (10) and the electrical length of ¼ wavelength

[Ex. 10]

$$\sqrt{2}Z_0 \tag{10}$$

604: inner conductor of a sixth connection line having the impedance of Z0 and the electrical length of ¼ wavelength
605: power combination part
606: coaxial line for inputting/outputting electric power to the power combiner/distributor
607: inner conductor of the coaxial line 606
608: outer conductor of the coaxial line 606
610: output side coaxial line connector
611 to 614: input side coaxial line connector Next, the operation of the power combiner according to the sixth embodiment of the present invention is described. First, there is considered a case in which all of the plurality of amplifiers connected to the power combiner according to the sixth embodiment of the present invention operate normally, and signals of equal amplitude and in-phase are input from the input side coaxial line connectors 611, 612, 613, and 614. An equivalent circuit in this case is represented by FIG. 1 described above, illustrating the first embodiment. Accordingly, electric powers input from the coaxial lines are combined together and the combined power is output from the output side coaxial line connector 610.

Figure 24:
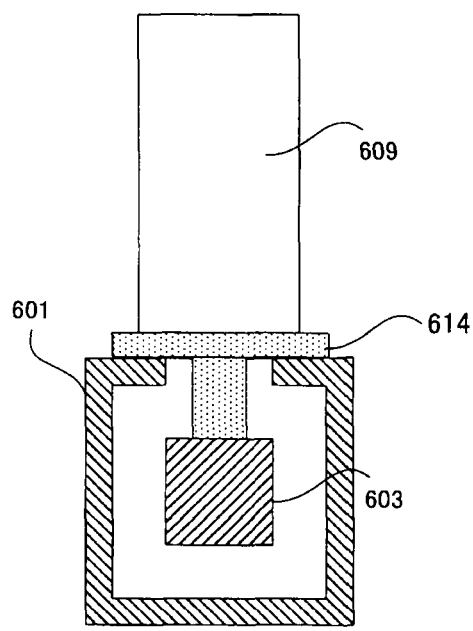
FIG. 24 is a cross-sectional view of an input side coaxial line connector of the power combiner using the rectangular coaxial line according to the sixth embodiment of the present invention, in which an amplifier connected to the input side coaxial line connector fails.
Figure 25:
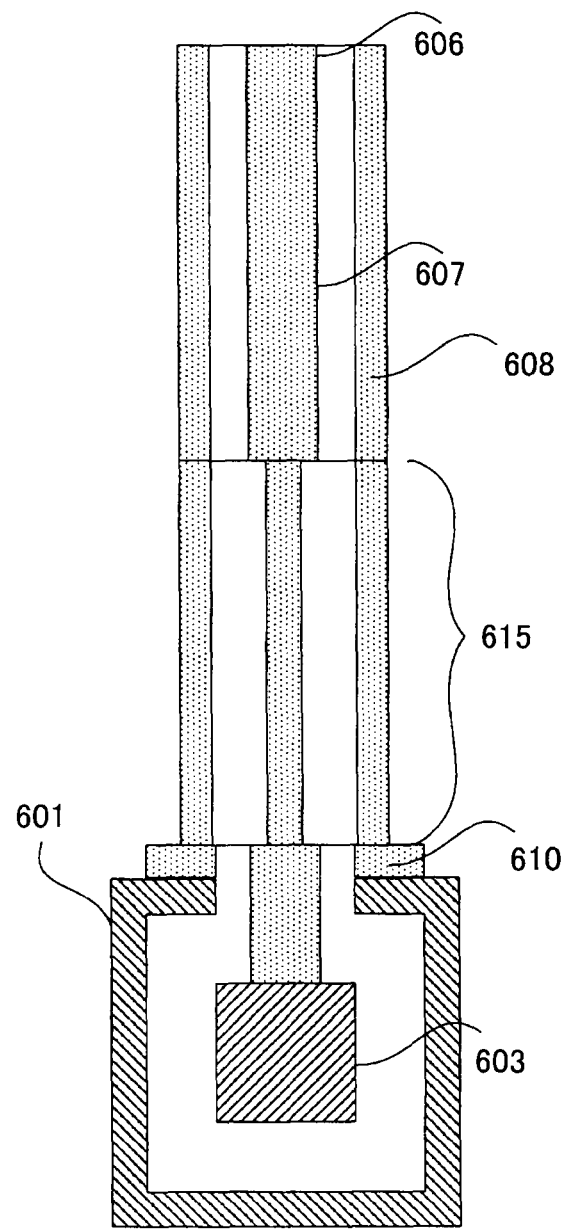
FIG. 25 is a cross-sectional view of an output side coaxial line connector of the power combiner using the rectangular coaxial line according to the sixth embodiment of the present invention, in which an amplifier connected to the input side coaxial line connector fails.

Next, there is considered a case in which among the plurality of amplifiers connected to the power combiner according to the sixth embodiment of the present invention, the amplifier connected to the input side coaxial line connector 614 fails. FIG. 24 is a cross-sectional view of the input side coaxial line connector 614 when the amplifier connected to the input side coaxial line connector 614 fails, in the power combiner using the rectangular coaxial line according to the sixth embodiment of the present invention. FIG. 25 is a cross-sectional view of the output side coaxial line connector 610 when the amplifier connected to the input side coaxial line connector 614 fails, in the power combiner using the rectangular coaxial line according to the sixth embodiment of the present invention.

As illustrated in FIG. 24, a short connector 609 is connected to the input side coaxial line connector 614 connected to the failed amplifier to short-circuit the input side coaxial line connector 614. The electrical length of the rectangular coaxial line 602 is set to about ½ wavelength so that the impedance of the short connector side in the power combination part 605 becomes infinite.

In the power combiner using the rectangular coaxial line according to the sixth embodiment, the output side coaxial line connector 610 is connected to the coaxial line 606 through the impedance transformer 615. An equivalent circuit in this case is illustrated in FIG. 4 described above. Accordingly, all of the electric powers input to the input side coaxial line connectors 611, 612, and 613 are combined together without any combination loss caused by the impedance mismatching, and the combined power is output from the output side coaxial line connector 610.

As described above, according to the sixth embodiment, in the power combiner using the rectangular coaxial line, the input side coaxial line connector connected to the failed amplifier is short-circuit by connecting to the short connector, and the output side coaxial line connector is connected to the coaxial line through the impedance transformer. As a result, the effects described in the above-mentioned first to fifth embodiments can be realized in the power combiner using the rectangular coaxial line.

Seventh Embodiment

Figure 26:
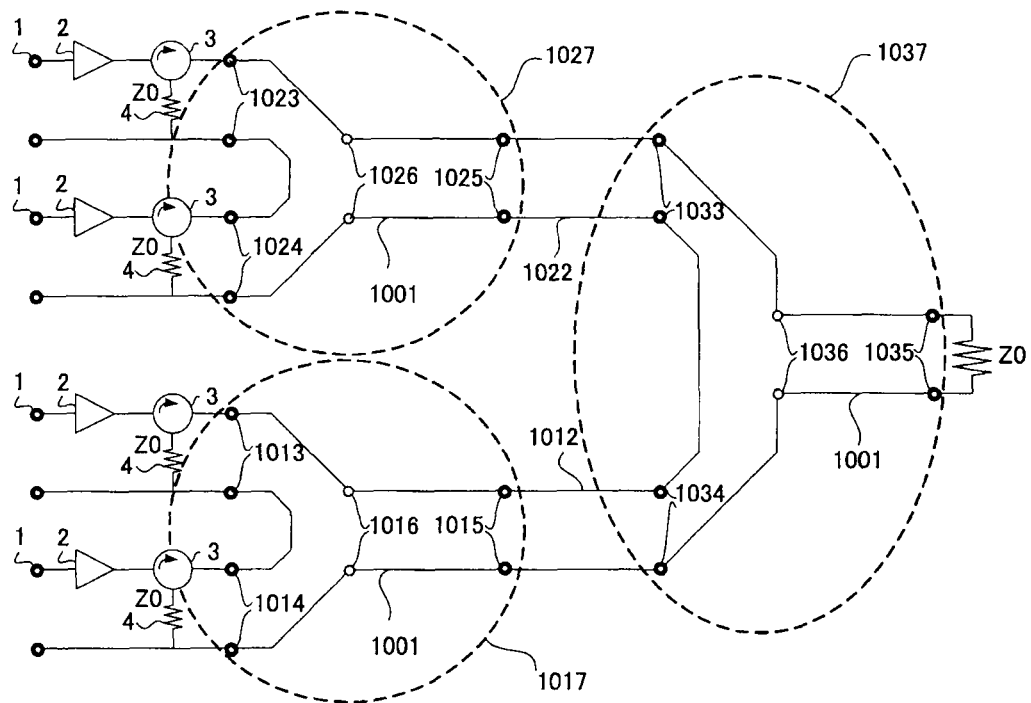
FIG. 26 is a circuit diagram of a power combiner according to a seventh embodiment of the present invention.

FIG. 26 is a circuit diagram of a power combiner according to a seventh embodiment of the present invention. The power combiner according to the seventh embodiment illustrated in FIG. 26 includes first impedance transformers 1001, first connection lines 1012 and 1022, first branch side terminals 1013, 1014, 1023, 1024, 1033, and 1034, first combination side terminals 1015, 1025, and 1035, and first power combination points 1016, 1026, and 1036. Each of the first connection lines 1012 and 1022 has an electrical length equal to an odd multiple of about ¼ wavelength.

The power combiner/distributor illustrated in FIG. 26 has three first branch circuits 1017, 1027, and 1037 (corresponding to portions indicated by dotted circles of FIG. 26), and the three first branch circuits 1017, 1027, and 1037 are connected through the first connection lines 1012 and 1022 in a tournament fashion. The first branch circuit 1017 includes the first impedance transformer 1001, the first branch side terminals 1013 and 1014, the first combination side terminal 1015, and the first power combination point 1016.

Further, the first branch circuit 1027 includes the first impedance transformers 1001, the first branch side terminals 1023 and 1024, the first combination side terminal 1025, and the first power combination point 1026. Further, the first branch circuit 1037 includes the first impedance transformer 1001, the first branch side terminals 1033 and 1034, the first combination side terminal 1035, and the first power combination point 1036.

In this embodiment, impedances of the input terminal 1 side at the first branch side terminals 1013, 1014, 1023, 1024, 1033, and 1034, impedances of the first power combination point side at the first combination side terminals 1015, 1025, and 1035, and impedances of the first connection lines 1012 and 1022 are the same value of Z0.

That is, when the first branch circuit 1017 is described as an example, the first impedance transformer 1001 is configured by a line, which has the impedance Zt represented by the above Expression (1), having an electrical length equal to an odd multiple of ¼ wavelength so that the impedance of the first power combination point 1036 side at the first combination side terminal 1015 becomes Z0.

Next, operation of the power combiner according to the seventh embodiment of the present invention is described. First, a case in which all of the plurality of amplifiers connected to the power combiner according to the seventh embodiment of the present invention operate normally is considered. It is assumed that the same signals are input to the input terminals 1 of the respective amplifiers, the input electric powers are amplified by the respective amplifiers 2, and the amplified electric powers are input to the respective first branch side terminals 1013, 1014, 1023, and 1024 as signals having the same amplitude phase. Further, it is assumed that the impedances at the first branch side terminals 1013, 1014, 1023, and 1024 are Z0.

The respective impedances of the first branch side terminal 1013 side and the first branch side terminal 1014 side at the first power combination point 1016 are Z0. In this embodiment, the first branch side terminal 1013 and the first branch side terminal 1014 are connected in series, and hence the impedance of the first branch side terminal 1013 side and the first branch side terminal 1014 side at the first power combination point 1016 becomes 2Z0. The impedance is transformed by the first impedance transformer 1001, and hence the impedance of the first power combination point 1016 side at the first combination side terminal 1015 becomes Z0.

The first branch circuit 1027 is similar to the first branch circuit 1017, and hence the impedances of the first branch circuits 1027 and 1017 side at the first branch side terminals 1033 and 1034, respectively, become Z0. Accordingly, the first branch circuit 1037 is also similar to the first branch circuit 1017, and hence the impedance of the first power combination point 1036 side at the first combination side terminal 1035 becomes Z0. Further, a load impedance connected to the first combination side terminal 1035 is also Z0.

From the above viewpoint, the electric powers input to the input terminals 1 of the amplifiers are amplified by the amplifiers 2, combined together without any loss caused by impedance mismatching, and the combined power is output from the first combination side terminal 1035.

Figure 27:
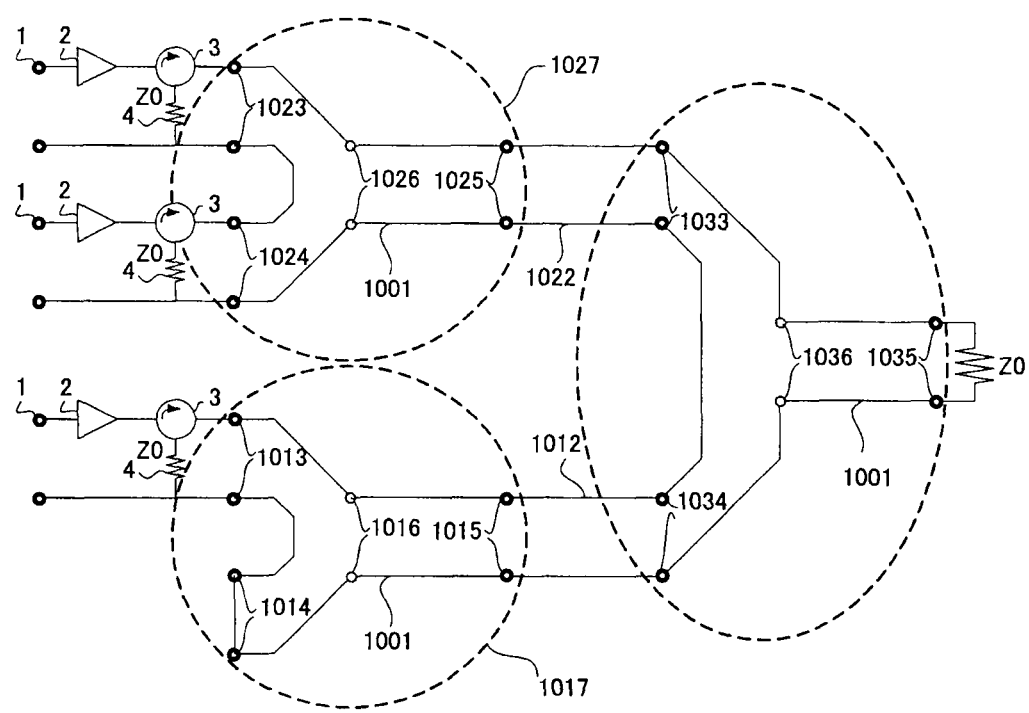
FIG. 27 is a circuit diagram of the power combiner according to the seventh embodiment of the present invention, in which an amplifier connected to the first branch side terminal fails.

Next, there is considered a case in which, among the plurality of amplifiers connected to the power combiner/distributor according to the seventh embodiment of the present invention, the amplifier connected to the first branch side terminal 1014 fails, and signals are input only from the first branch side terminals 1013, 1023, and 1024. FIG. 27 is a circuit diagram of the power combiner according to the seventh embodiment of the present invention, in which the amplifier connected to the first branch side terminal 1014 fails. FIG. 27 illustrates a state in which, when the above-mentioned failure occurs, the failed amplifier is removed from the power combiner and the first branch side terminal 1014 is so terminated as to be short-circuited.

The amplifiers connected to the first branch circuit 1027 operate in the normal state, and hence the impedance of the first branch circuit 1027 side at the first branch side terminal 1033 becomes Z0.

Further, the first branch side terminal 1014 is short-circuited, and hence the impedance of the first branch side terminal 1013 side at the first power combination point 1016 becomes Z0. Further, the impedance is transformed by the first impedance transformer, and hence the impedance of the first power combination point 1016 side at the first combination side terminal 1015 becomes 2Z0.

The first connection line 1012 has the impedance of Z0 and the electrical length of the odd multiple of ¼ wavelength. Accordingly, the first connection line 1012 operates as the impedance transformer, and the impedance of the first connection line 1012 side at the first branch side terminal 1034 becomes Z0/2.

That is, the impedance of the first branch side terminal 1033 side at the first power combination point 1036 is Z0 and the impedance of the first branch side terminal 1034 side at the first power combination point 1036 is Z0/2, and those impedances are connected in series. Accordingly, the first branch circuit 1037 is a first branch circuit that combines the electric powers together without any impedance mismatching when the electric power from the first branch side terminal 1033 side and the electric power from the first branch side terminal 1034 side are combined together at a ratio of 2:1.

On the other hand, the signal input from the first branch side terminal 1034 side is only an electric power from the amplifier connected to the first branch side terminal 1013, and the signal input from the first branch side terminal 1033 side is a combined electric power from the two amplifiers connected to the first branch side terminals 1023 and 1024. From this viewpoint, the ratio of the electric power from the first branch side terminal 1033 side and the electric power from the first branch side terminal 1034 side is 2:1. As a result, the electric powers are combined together without any loss caused by the impedance mismatching within the power combiner, and the combined power is output from the first combination side terminal 1035.

As described above, according to the power combiner of the seventh embodiment, when the amplifiers that operate in parallel operate normally, the electric powers can be combined together without any combination loss caused by the impedance mismatching within the power combiner. Further, even when a part of the amplifiers that operate in parallel fail, the first branch side terminal connected to the failed amplifier is short-circuited so that the electric powers can be combined together without any combination loss caused by the impedance mismatching within the power combiner.

Note that, in the seventh embodiment, the first impedance transformer has a line having the impedance represented by the above Expression (1) and the electrical length of the odd multiple of ¼ wavelength. However, the present invention is not limited to this configuration, and may be configured by impedance transformers, such as impedance transformers in which ¼ wavelength are cascade-connected in series with each other or impedance transformers using tapered lines, which can realize the impedance matching at the first branch circuits 1017, 1027, and 1037 when the amplifiers operate normally. Further, the length of the first connection line may be adjusted so that the lengths between the first power combination point 1016 and the first power combination point 1036 and between the first power combination point 1026 and the first power combination point 1036 each become the integral multiple of ½ wavelength.

Further, in the seventh embodiment, a case in which only the amplifier connected to the first branch side terminal 1014 fails is described. However, the present invention is not limited to this case, and the same effects are obtained by short-circuiting the terminal connected to the failed amplifier even when the amplifiers connected to the plurality of first branch side terminals fail.

Further, in the seventh embodiment, when the amplifiers connected in parallel operate normally, all of the impedances of the circuits connected to the first branch side terminals 1013, 1014, 1023, 1024, 1033, and 1034, and the first combination side terminal 135 are the same as each other. However, the present invention is not limited to this configuration, and the respective load impedances may be arbitrary values. Note that, the circuits within the power combiner are designed to have such values that no impedance mismatching occurs when the amplifiers connected in parallel operate normally.

Further, in the seventh embodiment, three first branch circuits are connected in a tournament fashion. However, the present invention is not limited to this configuration, and two first branch circuits only need to be connected by the first connection line.

Further, in the seventh embodiment, the first branch circuits 1017, 1027, and 1037 each having two first branch side terminals and one first combination side terminal are connected in the tournament fashion. However, the present invention is not limited to this configuration, and a part or all of the first branch circuits may be each configured by a first branch circuit having K first branch side terminals (K is an integer of two or more) and one first combination side terminal.

Further, in the seventh embodiment, when the amplifier connected to the first branch side terminal 1014 fails, the first branch side terminal 1014 is short-circuited. However, the present invention is not limited to this configuration, and only needs to be applied to a configuration in which the first branch side terminal 1014 where the amplifier fails is terminated so that the impedance at the first branch side terminal 1014 is short-circuited. For example, the present invention may be applied to a line having the electrical length of ¼ wavelength whose leading end is opened to the first branch side terminal 1014, or a line having the electrical length equal to the integral multiple of ½ wavelength whose leading end is short-circuited.

Further, in the seventh embodiment, when the amplifier connected to the first branch terminal 1014 fails, the impedance at the first combination side terminal 1035 becomes 4/3Z0 because the impedance of Z0 of the first branch side terminal 1033 side and the impedance of Z0/2 of the first branch side terminal 1034 side are connected in series and the impedance is transformed by the first impedance transformer 1001.

Figure 28:
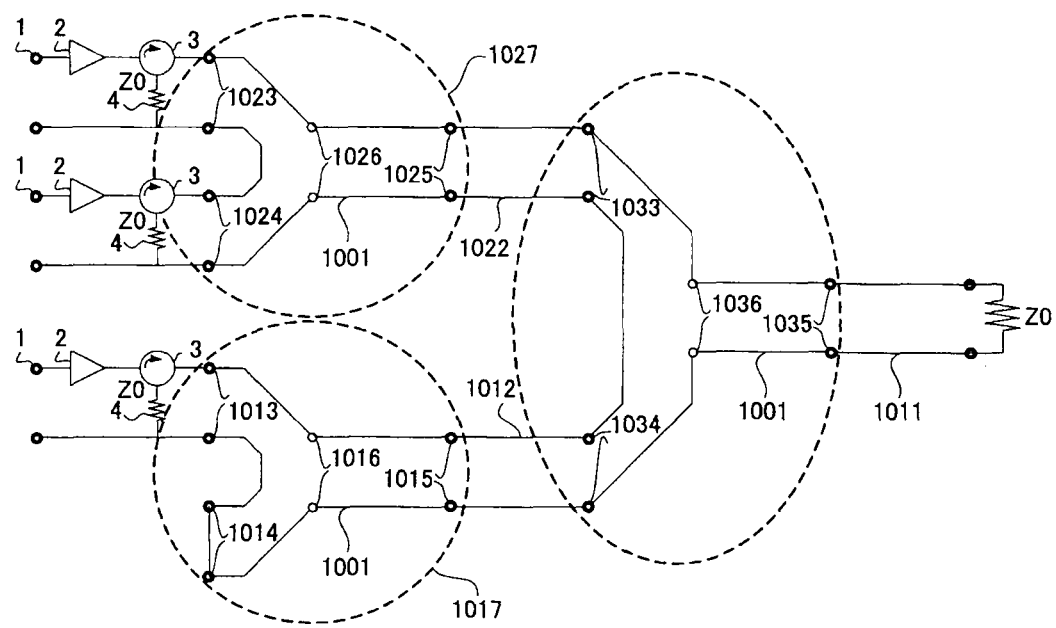
FIG. 28 is a circuit diagram of the power combiner according to the seventh embodiment of the present invention, in which the reflection loss is set to 0 when the amplifier connected to the first branch side terminal fails.

On the other hand, the load impedance connected to the first combination side terminal 1035 becomes Z0, and hence the impedance mismatching occurs at the first combination side terminal 1035, thereby causing the reflection loss. FIG. 28 is a circuit diagram of the power combiner according to the seventh embodiment of the present invention, in which the reflection loss is set to 0 when the amplifier connected to the first branch side terminal 1014 fails. As illustrated in FIG. 28, a first matching impedance transformer 1011 which is a line having the line length of the odd multiple of ¼ wavelength and the impedance represented by the above Expression (2) is connected to the first combination side terminal 1035, and the impedance matching at the first combination side terminal 1035 is realized so that the reflection loss can be set to 0.

In FIG. 28, the first matching impedance transformer 1011 is connected to the first power combination point 1036. However, the present invention is not limited to this configuration, and the first matching impedance transformer 1011 may be connected between the first branch side terminals 1013, 1014, 1023, 1024 and the circulators 3, respectively, as the impedance where the reflection loss is 0.

Further, in the seventh embodiment, the first matching impedance transformer 1011 is configured by the impedance transformer which is a line having the line length of the odd multiple of ¼ wavelength and the impedance represented by the above Expression (2). However, the present invention is not limited to this configuration, and the same effects are obtained by connecting the impedance transformer that matches the impedance mismatching at the first combination side terminal 1035 according to the short-circuited first branch side terminal.

Further, in the seventh embodiment, a case in which the electric powers of the plurality of amplifiers that operate in parallel are combined together is described. However, the present invention is not limited to this case, and the same effects are obtained even when the electric powers from the plurality of antennas are combined together. Further, in the seventh embodiment, the power combiner that combines the electric powers together is described. However, the same effects are obtained even when the present invention is used as a power divider that divides the electric power.

Figure 29:
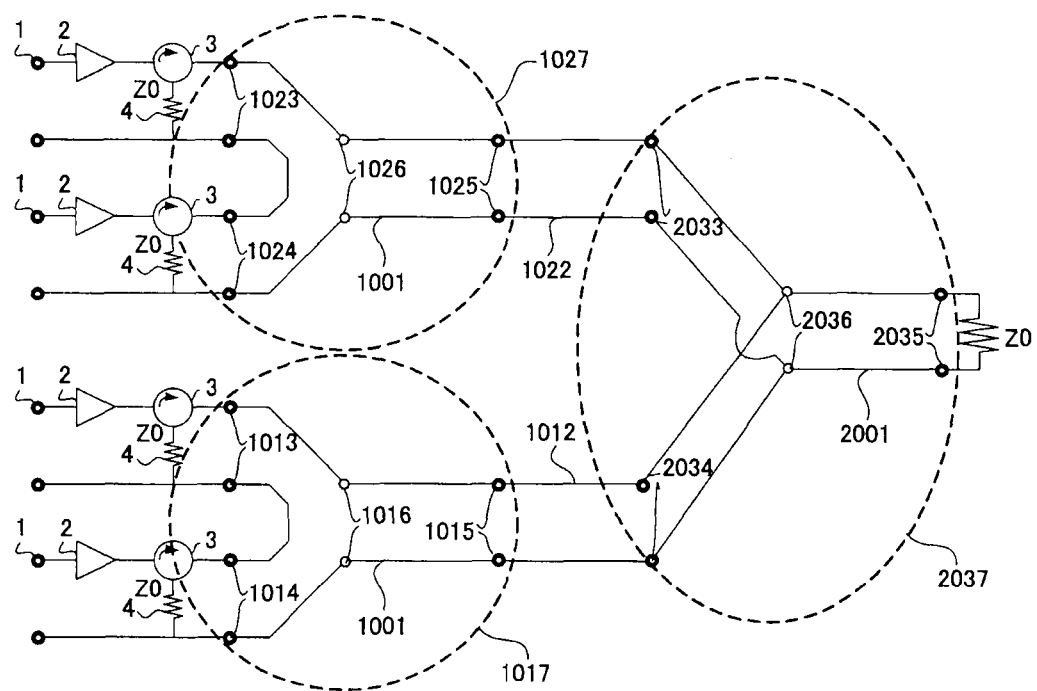
FIG. 29 is a circuit diagram of a power combiner configured by a first branch circuit of a series branch circuit according to the seventh embodiment of the present invention and a second branch circuit of a parallel branch circuit.

Further, in the seventh embodiment, a case in which the three first branch circuits which are series branch circuits are connected in the tournament fashion is described. However, the present invention is not limited to this case. FIG. 29 is a circuit diagram of a power combiner configured by the first branch circuit of the series branch circuit according the seventh embodiment of the present invention and a second branch circuit of a parallel branch circuit. As illustrated in FIG. 29, the same effects are obtained by the configuration in which the first branch circuits 1017 and 1027 that are two series branch circuits are connected to a second branch circuit 2037 that is the parallel branch circuit. Note that, in this case, the electrical lengths of the first connection lines 1012 and 1022 are each set to the integral multiple of ½ wavelength so that the electrical lengths between the first power combination point 1026 and a second power combination point 2036, and between the first power combination point 1016 and the second power combination point 2036 each become the odd multiple of ¼ wavelength.

The points of the above-mentioned first to seventh embodiments are described below.

In the first to seventh embodiments, the power combiner/distributor according to the present invention, which is configured by the series branch circuit, the parallel separation circuit, and the circuit combining those circuits, is described. In all of those cases, the common technical feature resides in that "the connection line length between the stages is determined so that the length between the power combination points of the two connected branch circuits becomes the integral multiple of ½ wavelength, and the power combiner/distributor is configured by using such a connection line".

With the above-mentioned configuration, even when one or more amplifiers fail, the terminal connected to the failed amplifier is opened or short-circuited so that operation can be conducted without the combination loss and the distribution loss, as described above.

The tournament connection is described as supplements. In the above-mentioned first to seventh embodiments, a case in which three branch circuits are connected in the tournament fashion is described in detail. Further, the configuration is described to be as follows. The two first branch circuits only need to be connected by the first connection line. For example, the $(2^n-1)$ (n is a natural number) branch circuits may be connected in the tournament fashion or connected in series. Such connection configurations are described in detail.

Figure 30:
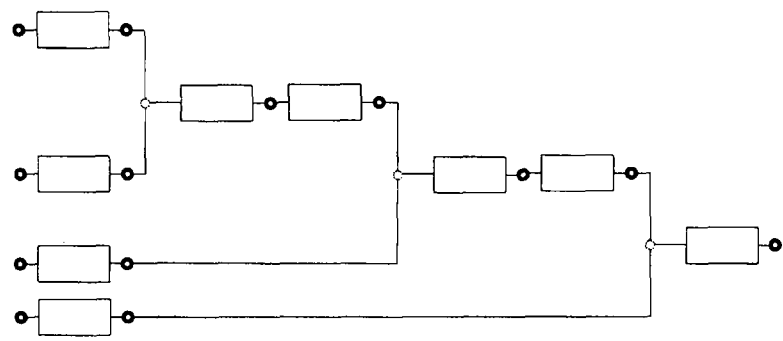
FIGS. 30A and 30B are diagrams each illustrating a connection configuration of branch circuits applicable to a power combiner/distributor of the present invention.
Figure 30:
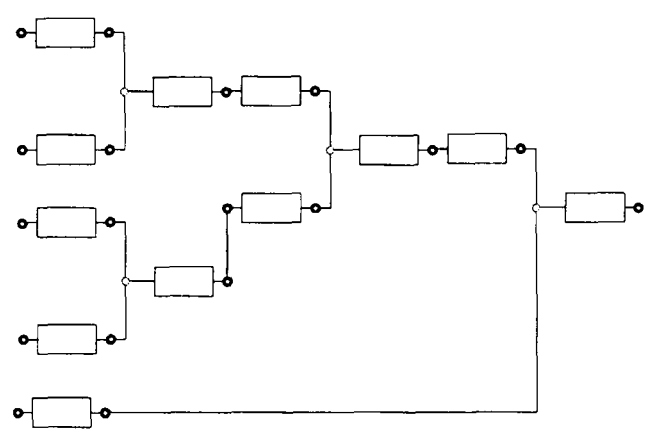

FIGS. 30A and 30B are diagrams each illustrating a connection configuration of branch circuits applicable to the power combiner/distributor of the present invention. The connection configuration of the branch circuits is not limited to a case of connecting the $(2^n-1)$ (n is a natural number) branch circuits by the tournament connections, and as illustrated in FIGS. 30A and 30B, the same effects can be obtained by the connection configuration in which the branch circuits different in configuration are connected in series, or a part in which the tournament configuration is replaced with series connection. Therefore, in the present invention, not only the configuration in which the $(2^n-1)$ (n is a natural number) branch circuits are connected by the tournament connection, but also the configuration of the partial replacement as illustrated in FIGS. 30A and 30B is referred to as "tournament configuration".

Further, in the seventh embodiment, the power combiner/distributor using the series branch circuit is described. The parallel branch circuit and the series branch circuit are described as supplements.

Figure 31:
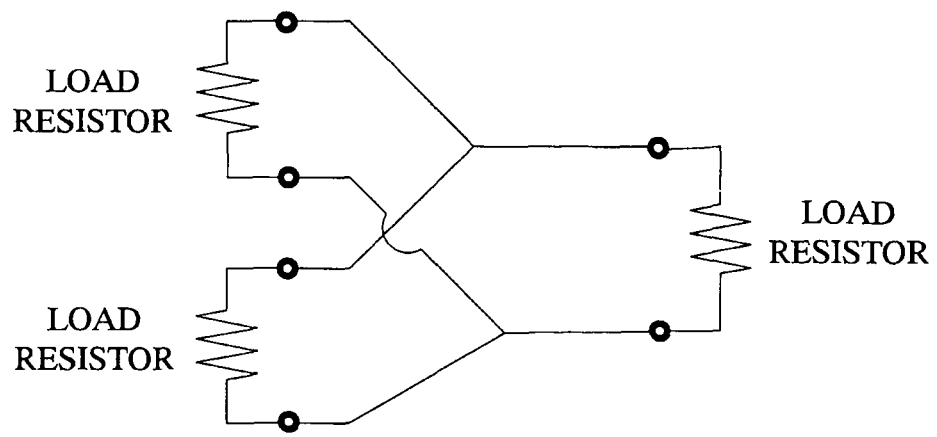
FIG. 31 is a diagram illustrating a basic configuration of a parallel branch circuit applicable to the power combiner/distributor of the present invention.
Figure 32:
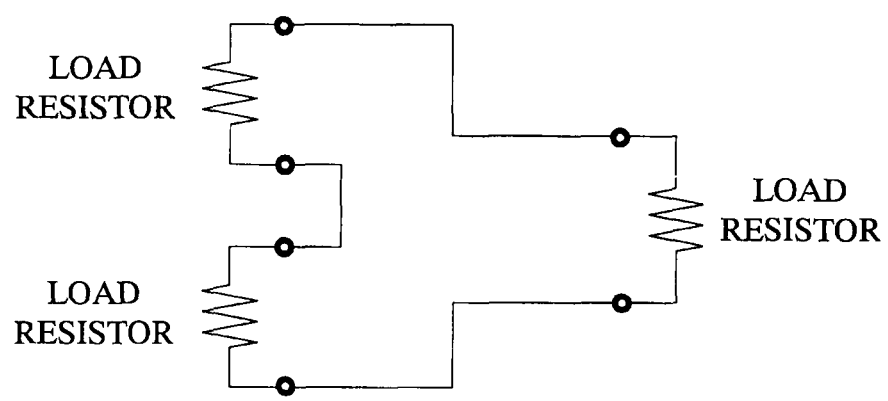
FIG. 32 is a diagram illustrating a basic configuration of a series branch circuit applicable to the power combiner/distributor of the present invention.

FIG. 31 is a diagram illustrating a basic configuration of the parallel branch circuit applicable to the power combiner/distributor of the present invention. FIG. 32 is a diagram illustrating a basic configuration of the series branch circuit applicable to the power combiner/distributor of the present invention.

In the above-mentioned first to sixth embodiments, the case in which the parallel branch circuit (branch circuit using a microstrip line, etc.) as illustrated in FIG. 31 is used is described. On the other hand, in the seventh embodiment, the case in which the series branch circuit (branch circuit using an E-face branch of a waveguide, etc.) as illustrated in FIG. 32 is used (see FIGS. 26 to 28), and the case in which the parallel branch circuit and the series branch circuit are combined together (see FIG. 29) are described.

Differences between the case of using only the parallel branch circuit and the case of using only the series branch circuit, and points to be noted in the case of using only the parallel branch circuit and the case of combining the parallel branch circuit and the series branch circuit together are described below.

[1] Differences Between the Case of Using Only the Parallel Branch Circuit and the Case of Using Only the Series Branch Circuit (1-1) Termination Conditions for a Terminal Connected to a Failed Amplifier When the parallel branch circuit is used, as described in the first to sixth embodiments, termination is made so that the impedance of the branch side terminal side that was connected to the amplifier at the power combination point within the branch circuit becomes infinite (opened). On the other hand, when the series branch circuit is used, as described in the seventh embodiment, the termination is made so that the impedance of the branch side terminal side that was connected to the amplifier at the power combination point within the branch circuit becomes 0 (short-circuited), which is different therebetween.

(1-2) Impedance Transformer Connected to the Input/Output Terminal for Reduction of the Reflection Loss There is considered a case in which, when M amplifiers operate in parallel, N amplifiers operate normally and (M−N) amplifiers fail. In this case, the power combiner/distributor using the series branch circuit and the power combiner/distributor using the parallel branch circuit have a relationship that, in order to reduce the reflection loss, the numerator and denominator of the coefficient of the impedance value of the impedance transformer connected to the output terminal (for example, the first combination side terminal 135 of FIG. 1) are inverted.

More specially, in the parallel branch circuit, for example, the impedance transformer having the electrical length of the odd multiple of ¼ wavelength and the impedance represented by the above Expression (7) is connected to the second combination side terminal.

On the other hand, in the series branch circuit, for example, the impedance transformer having the electrical length of the odd multiple of ¼ wavelength and the impedance represented by the above Expression (8) is connected to the second combination side terminal with a relationship where the numerator and denominator of the coefficient of the impedance value are inverted.

Note that, the parallel branch circuit and the series branch circuit are the same as each other in that the connection line length between the stages is determined so that the length between the power combination points of the two connected branch circuits becomes the integral multiple of ½ wavelength.

[2] Points to be Noted in the Case of Using Only the Parallel Branch Circuit and the Case of Combining the Parallel Branch Circuit and the Series Branch Circuit Together (2-1) Termination Conditions for the Terminal that was Connected to the Failed Amplifier Termination conditions for the terminal that was connected to the failed amplifier are determined according to the type of branch circuits that was connected directly to the failed amplifier. That is, when the branch circuit that was connected directly to the failed amplifier is the parallel branch circuit, termination is made so that the impedance of the branch side terminal side that was connected to the amplifier at the power combination point within the branch circuit becomes infinite (opened).

On the other hand, when the branch circuit that was connected directly to the failed amplifier is the series branch circuit, termination is made so that the impedance of the branch side terminal side that was connected to the amplifier at the power combination point within the branch circuit becomes 0 (short-circuited).

(2-2) Impedance Transformer Connected to the Input/Output Terminal for Reduction of the Reflection Loss The impedance transformer is determined according to the type of the branch circuit including the output end of the power combiner/distributor (that is, branch circuit at the final stage). For example, when the final stage is the parallel branch circuit in which the impedance transformer is disposed at the combination side terminal side, the impedance transformer having the impedance represented by the above Expression (7) is connected.

On the other hand, when the final stage is the series branch circuit in which the impedance transformer is disposed at the combination side terminal side, the impedance transformer having the impedance represented by the above Expression (8) is connected.

Further, when the final stage is the parallel branch circuit in which the impedance transformer is disposed at the branch side terminal side, the impedance transformer having the impedance represented by the above Expression (8) is connected. On the other hand, when the final stage is the series branch circuit in which the impedance transformer is disposed at the branch side terminal side, the impedance transformer having the impedance represented by the above Expression (7) is connected.

(2-3) Conditions for Connection Line

When the power divider circuit includes only one of the parallel branch circuit and the series branch circuit, the connection line length between the stages is determined so that the length between the power combination points of the two connected branch circuits becomes the integral multiple of ½ wavelength.

On the other hand, the electrical length of the connection line that connects the parallel branch circuit and the series branch circuit is "such a length that the length between the power combination points of the two connected branch circuits becomes the odd multiple of ¼ wavelength". That is, this length is different from the case of the power divider circuit including only one of the parallel branch circuit and the series branch circuit.

Figure 33:
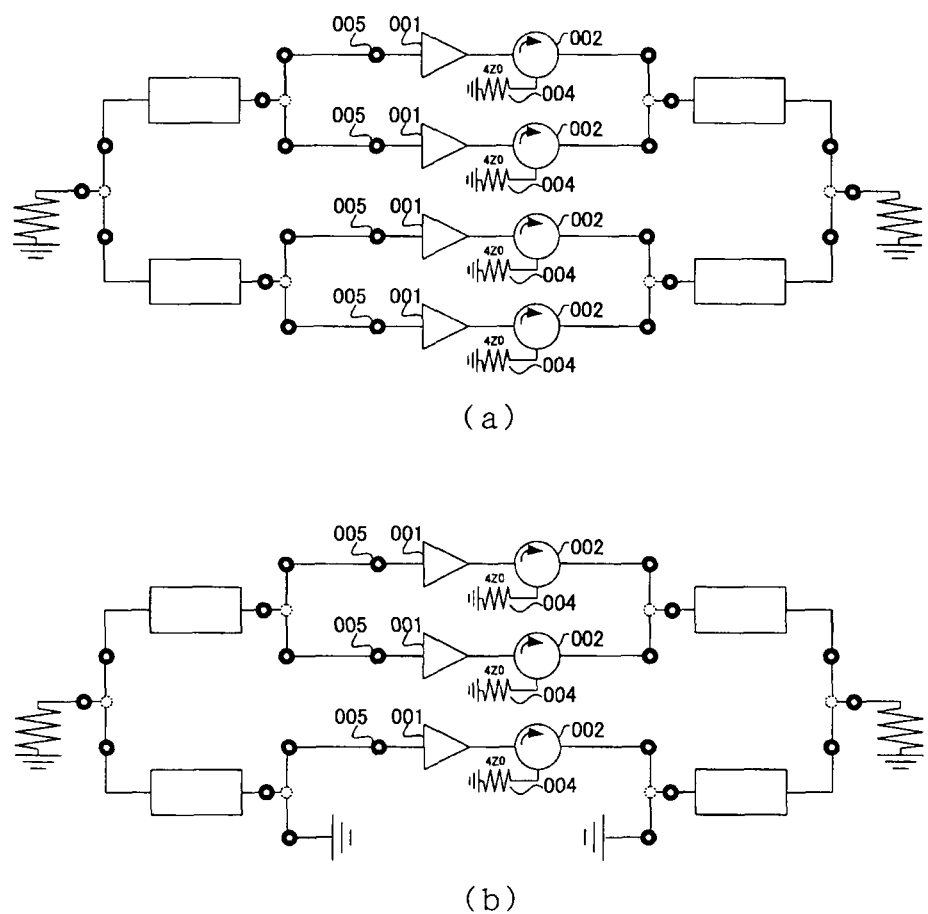
FIGS. 33A and 33B are configuration diagrams of transmitters in which the power combiners/dividers of the present invention are used at input/output terminals of a plurality of amplifiers that operate in parallel.

Finally, a configuration in which a plurality of power combiners/dividers described in the first to seventh embodiments of the present invention operate in parallel is described with reference to the drawings. FIGS. 33A and 33B are configuration diagrams of transmitters in which the power combiners/dividers of the present invention are used at the input/output terminals of a plurality of amplifiers that operate in parallel. More specifically, FIG. 33A illustrates a configuration in which all of the amplifiers connected to the power combiners/dividers operate normally, and FIG. 33B illustrates a configuration in which the respective terminals from which the failed amplifiers are removed are terminated among the amplifiers connected to the power combiners/dividers. The power combiner/distributor according to the present invention can be applied to the transmitters with the configurations illustrated in FIGS. 33A and 33B.

What is claimed is:

1. A power combiner/distributor for performing one of power combination and power division, comprising:
   a first branch circuit having a plurality of first branch side terminals connected in parallel and one first combination side terminal, which are connected through a first power combination point; and
   a second branch circuit having a plurality of second branch side terminals connected in parallel and one second combination side terminal, which are connected through a second power combination point,
   the one first combination side terminal and one of the plurality of second branch side terminals being connected to each other,
   wherein
      an impedance transformer is disposed between the first power combination point and the one first combination side terminal, and
      a length from the first power combination point to the second power combination point is an integral multiple of ½ wavelength.

2. The power combiner/distributor according to claim 1, wherein:
   the one first combination side terminal and the one of the plurality of second branch side terminals are connected through a first connection line having a length of an odd multiple of ¼ wavelength, and
   the impedance transformer has a length of an odd multiple of ¼ wavelength.

3. The power combiner/distributor according to claim 1, wherein:
   the one first combination side terminal and the one of the plurality of second branch side terminals are connected through a first connection line having a length of an integral multiple of ½ wavelength,
the impedance transformer has a length of an odd multiple of ¼ wavelength, and
a second impedance transformer having a length of an odd multiple of ¼ wavelength is disposed between the one of the plurality of second branch side terminals connected to the first connection line and the second power combination point.

4. The power combiner/distributor according to claim 1, wherein at least one of the plurality of first branch side terminals is terminated with total reflection so that an impedance of the first branch side terminal side at the first power combination point becomes infinite.

5. A power combiner/distributor for performing one of power combination and power division, comprising:
a first branch circuit having a plurality of first branch side terminals connected in series and one first combination side terminal, which are connected through a first power combination point; and
a second branch circuit having a plurality of second branch side terminals connected in series and one second combination side terminal, which are connected through a second power combination point,
the one first combination side terminal and one of the plurality of second branch side terminals being connected to each other,
wherein
an impedance transformer is disposed between the first power combination point and the one first combination side terminal, and
a length from the first power combination point to the second power combination point is an integral multiple of ½ wavelength.

6. The power combiner/distributor according to claim 5, wherein:
the one first combination side terminal and the one of the plurality of second branch side terminals are connected through a first connection line having a length of an odd multiple of ¼ wavelength, and
the impedance transformer has a length of an odd multiple of ¼ wavelength.

7. The power combiner/distributor according to claim 5, wherein:
the one first combination side terminal and the one of the plurality of second branch side terminals are connected through a first connection line having a length of an integral multiple of ½ wavelength,
the impedance transformer has a length of an odd multiple of ¼ wavelength, and
a second impedance transformer having a length of an odd multiple of ¼ wavelength is disposed between the one of the plurality of second branch side terminals connected to the first connection line and the second power combination point.

8. The power combiner/distributor according to claim 5, wherein at least one of the plurality of first branch side terminals is terminated with total reflection so that an impedance of the first branch side terminal side at the first power combination point becomes 0.

9. A power combiner/distributor for performing one of power combination and power division, comprising:
a first branch circuit having a plurality of first branch side terminals connected in series and one first combination side terminal, which are connected through a first power combination point; and
a second branch circuit having a plurality of second branch side terminals connected in series and one second combination side terminal, which are connected through a second power combination point,
the one first combination side terminal and one of the plurality of second branch side terminals being connected to each other,
wherein
an impedance transformer is disposed between the first power combination point and the one first combination side terminal, and
a length from the first power combination point to the second power combination point is an odd multiple of ¼ wavelength.

10. The power combiner/distributor according to claim 9, wherein:
the one first combination side terminal and the one of the plurality of second branch side terminals are connected through a first connection line having a length of an integral multiple of ½ wavelength, and
the impedance transformer has a length of an odd multiple of ¼ wavelength.

11. The power combiner/distributor according to claim 9, wherein:
the one first combination side terminal and the one of the plurality of second branch side terminals are connected through a first connection line having a length of an odd multiple of ¼ wavelength,
the impedance transformer has a length of an odd multiple of ¼ wavelength, and
a second impedance transformer having a length of an odd multiple of ¼ wavelength is disposed between the one of the plurality of second branch side terminals connected to the first connection line and the second power combination point.

12. The power combiner/distributor according to claim 9, wherein at least one of the plurality of first branch side terminals is terminated with total reflection so that an impedance of the first branch side terminal side at the first power combination point becomes 0.

13. A power combiner/distributor for performing one of power combination and power division, comprising:
a first branch circuit having a plurality of first branch side terminals connected in parallel and one first combination side terminal, which are connected through a first power combination point; and
a second branch circuit having a plurality of second branch side terminals connected in series and one second combination side terminal, which are connected through a second power combination point,
the one first combination side terminal and one of the plurality of second branch side terminals being connected to each other,
wherein
an impedance transformer is disposed between the first power combination point and the one first combination side terminal, and
a length from the first power combination point to the second power combination point is an odd multiple of ¼ wavelength.

14. The power combiner/distributor according to claim 13, wherein:
the one first combination side terminal and the one of the plurality of second branch side terminals are connected through a first connection line having a length of an integral multiple of ½ wavelength, and the impedance transformer has a length of an odd multiple of ¼ wavelength.

15. The power combiner/distributor according to claim 13, wherein:
the one first combination side terminal and the one of the plurality of second branch side terminals are connected through a first connection line having a length of an odd multiple of ¼ wavelength,
the impedance transformer has a length of an odd multiple of ¼ wavelength, and
a second impedance transformer having a length of an odd multiple of ¼ wavelength is disposed between the one of the plurality of second branch side terminals connected to the first connection line and the second power combination point.

16. The power combiner/distributor according to claim 13, wherein at least one of the plurality of first branch side terminals is terminated with total reflection so that an impedance of the first branch side terminal side at the first power combination point becomes infinite.

17. A transmitter using in parallel a plurality of the power combiners/dividers according to any one of claims 1 to 12.

* * * * *